United States Patent [19]

Carns et al.

[11] Patent Number: 4,926,362
[45] Date of Patent: May 15, 1990

[54] AIRBASE SORTIE GENERATION ANALYSIS MODEL (ABSGAM)

[75] Inventors: Richard A. Carns; Peter M. Flick, both of Fairborn; John M. Byrnes, Centerville, all of Ohio

[73] Assignee: The United States of America as represented by the Secretary of the Air Force, Washington, D.C.

[21] Appl. No.: 182,285

[22] Filed: Apr. 7, 1988

[51] Int. Cl.⁵ .................. G06F 15/48; G06F 15/74
[52] U.S. Cl. .................................. 364/578; 364/423
[58] Field of Search ........................... 364/423, 578

[56] References Cited

U.S. PATENT DOCUMENTS

| | | | |
|---|---|---|---|
| 4,209,832 | 6/1980 | Gilham et al. | 364/578 |
| 4,604,718 | 8/1986 | Norman et al. | 364/578 |
| 4,705,477 | 11/1987 | Komorowski et al. | 364/578 |

Primary Examiner—Felix D. Gruber
Attorney, Agent, or Firm—Bernard F. Franz; Donald J. Singer

[57] ABSTRACT

ABSGAM is a computer model developed to predict the maximum sortie generation capability of aircraft operating from a typical USAF air base. The model allows the user to easily change input parameters to evaluate their effect on: (1) aircraft sortie rates, (2) cumulative sorties generated, (3) payload launched, and (4) material personnel required to support the air base operation. ABSGAM simulates (1) an air-base-attack and recovery, (2) reduced payload operations, (3) reduced maintenance capability, (4) extended turn-around time, and (5) aircraft attrition (both air and ground). Program input has been minimized for ease of use. Program output is available in tabular and graphical form. This model was developed as part of a technology assessment.

8 Claims, 11 Drawing Sheets

******** DAY 1 ************************************************************

| MSSN TIME | AVAIL ACFT | ATTR ACFT | DAMG ACFT | MAINT ACFT | 2 HR REPR | 8 HR REPR | 24 HR REPR | 10DA REPR | RETN ACFT | MSSN CPBL |
|---|---|---|---|---|---|---|---|---|---|---|
| 0530 | | | | AIR BASE CLOSED | | | | | | |
| 2153 | | | | AIR BASE OPENED | | | | | 0.00 | |

DAY 1 OPS SUMMARY

DAILY COMBAT ATTRITION = 0.00 ACFT

DAILY GROUND ATTRITION = 2.16 ACFT

CUM COMBAT ATTRITION = 0.00 ACFT

CUM GROUND ATTRITION = 2.16 ACFT

CUM ATTRITION = 2.16 ACFT

PERCENT ATTRITION = 3.00 %

DAY SORTIES = 0.00

DAILY PAYLOAD = 0.

CUMULATIVE SORTIES = 0.00

CUMULATIVE PAYLOAD = 0.

******** DAY 6 ************************************************************

| MSSN TIME | AVAIL ACFT | ATTR ACFT | DAMG ACFT | MAINT ACFT | 2 HR REPR | 8 HR REPR | 24 HR REPR | 10DA REPR | RETN ACFT | MSSN CPBL |
|---|---|---|---|---|---|---|---|---|---|---|
| 625 | 1.77 | 0.07 | 0.20 | 0.30 | 0.12 | 0.12 | 0.06 | 0.01 | 0.00 | 1.21 |
| 821 | 1.21 | 0.04 | 0.13 | 0.21 | 0.08 | 0.08 | 0.04 | 0.01 | 0.00 | 0.82 |
| 830 | | | | | | | | | | |
| 1007 | 0.82 | 0.03 | 0.09 | 0.14 | 0.05 | 0.05 | 0.03 | 0.00 | 13.00 | 0.56 |
| 1218 | 13.56 | 0.50 | 1.51 | 2.31 | 0.90 | 0.90 | 0.44 | 0.07 | 0.00 | 9.24 |
| 1416 | 9.24 | 0.34 | 1.03 | 1.58 | 0.61 | 0.61 | 0.30 | 0.05 | 0.05 | 6.30 |
| 1615 | 6.36 | 0.24 | 0.71 | 1.08 | 0.42 | 0.42 | 0.21 | 0.03 | 0.90 | 4.33 |
| 1800 | 5.23 | 0.19 | 0.58 | 0.89 | 0.35 | 0.35 | 0.17 | 0.03 | 13.62 | 3.57 |
| | | | | | | | | | 2.76 | |

DAY 6 OPS SUMMARY

DAILY COMBAT ATTRITION = 1.41 ACFT

DAILY GROUND ATTRITION = 0.00 ACFT

CUM COMBAT ATTRITION = 9.88 ACFT

CUM GROUND ATTRITION = 3.55 ACFT

CUM ATTRITION = 13.43 ACFT

PERCENT ATTRITION = 18.65 %

DAY SORTIES = 38.19

DAILY PAYLOAD = 358.

CUMULATIVE SORTIES = 236.18

CUMULATIVE PAYLOAD = 754.

*Fig. 4*

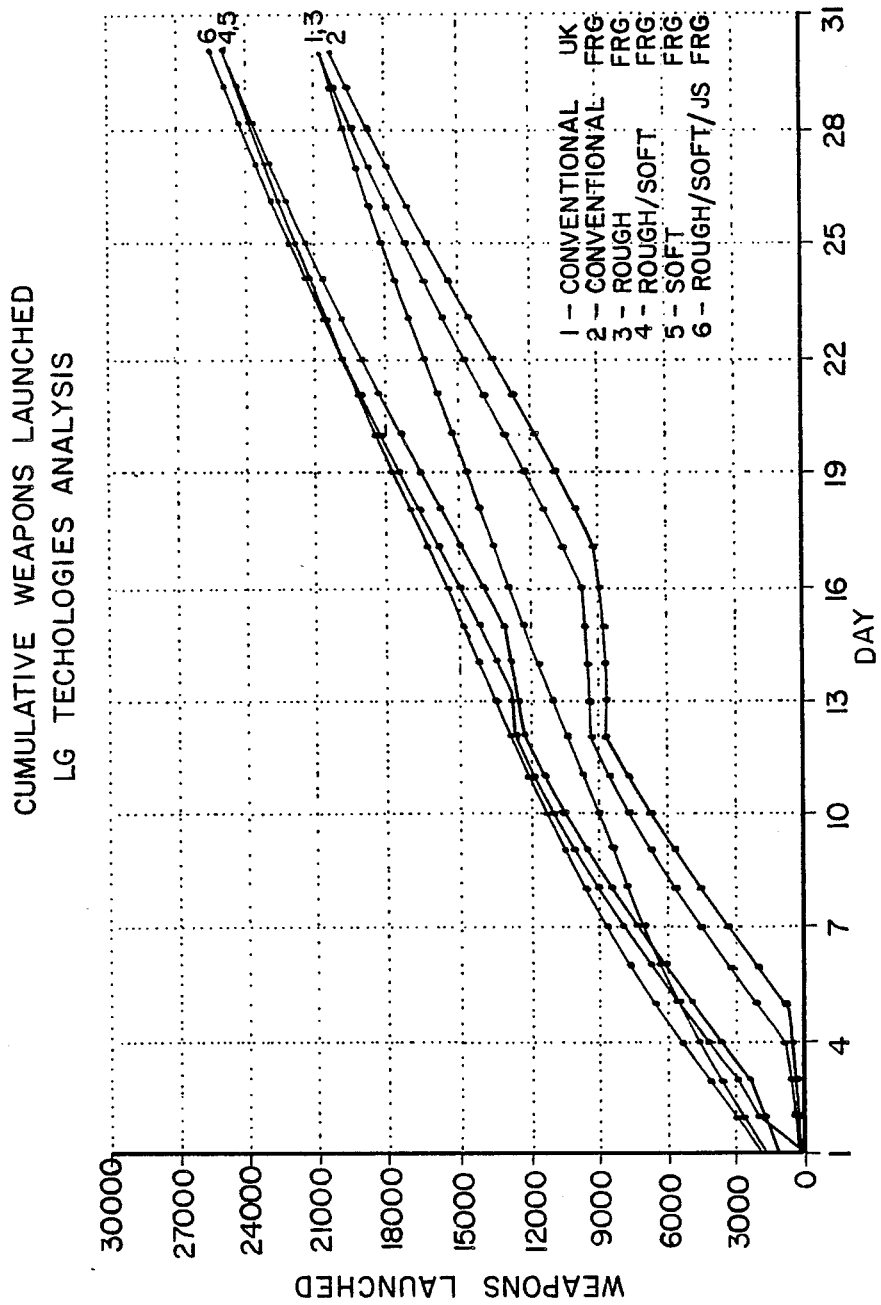

AIRBASE SORTIE GENERATION ANALYSIS MODEL (ABSGAM)

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a method used to predict the maximum sortie generation capability of aircraft operating from a typical air base, and more particularly to a method for use during the analysis phase of a vehicle design, to critique different features for their impact on performance. In addition, the method could be used to evaluate commercial transport systems such as trucking, shipping, airline/cargo, space transport, and auto rental; either the evaluation of existing vehicles or of new designs.

Different areas such as aircraft supportability, maintainability, and survivability and airbase survivability come together to influence the sortie generation capabilities of an aircraft. An aircraft force is armed and fueled for a mission. The mission is flown during which the aircraft are either damaged, attrited, returned for maintenance, or are immediately placed in the mission capable pool. This mission capable pool of aircraft is then armed and fueled for the next sortie. In evaluating the effectiveness of weapon system designs, it is desirable to stimulate the process. The simulation model should permit the user to change input parameters to evaluate their effect on: (1) aircraft sortie rates, (2) cumulative sorties generated, (3) payload launched, and (4) material/personnel required to support the air base operation.

Previously, the analysis and graphical representation of data was performed by hand. The process was slow and tedious, was a poor utilization of resources, and was time consuming. This hand analysis and graphics approach, combined with a normal limit on manpower, resulted in a limited study scope and understanding. On the other hand, there are known systems using large, complex sortie generation analysis code, but they are too expensive, manpower wise, for a small office (5 to 50 people) to operate, and generally take the full time support of 1 to 3 people, take 2 to 6 months to learn, require expertise in disciplines outside the scope of the study, and require a large mainframe computers.

SUMMARY OF THE INVENTION

An object of the invention is to provide a means to quickly and efficiently analyze the sortie generation capabilities and support requirements of vehicle designs and to perform effectiveness analyses on these designs, particularly for aircraft. A further object is to fill the gap between a simple, hand sortie generation analysis; and a large, complex sortie generation analysis code. More generally, an object is to provide a meanns for vehicle system effectiveness analysis.

The invention relates to a method, using a computer model, refered to as an Airbase Sortie Generation Analysis Model (ABSGAM) to predict the maximum sortie generation capability of aircraft operating from a typical air base. The model allows the user to easily change input parameters to evaluate their effect on: (1) aircraft sortie rates, (2) cumulative sorties generated, (3) payload launched, and (4) material/personnel required to support the air base operation. ABSGAM simulates (1) an air-base-attack and recovery, (2) reduced payload operations, (3) reduced maintenance capability, (4) extended turn-around time, and (5) aircraft attrition (both air and ground). Program input has been minimized for ease of use. Program output is available in tabular and graphical form.

Advantages

This software provides a quick and efficient means of analyzing the sortie generation capabilities of vehicle designs. The program is designed for easy use by requiring minimal user inputs. The built-in graphics capability provides high quality data plots and a much improved insight and understanding of the dynamic trends of the analysis. The user may select from eleven plotting options to display the data output. This allows the program to be used as a real time study tool—generating parametric trends, sensitivities, and trade-offs.

BRIEF DESCRIPTION OF THE DRAWING

FIGS. 4 and 5 are a tabular chart and a graph respectively which illustrate an example ef the outputs of the program.

DESCRIPTION OF THE PREFERRED EMBODIMENT

Figure 1:
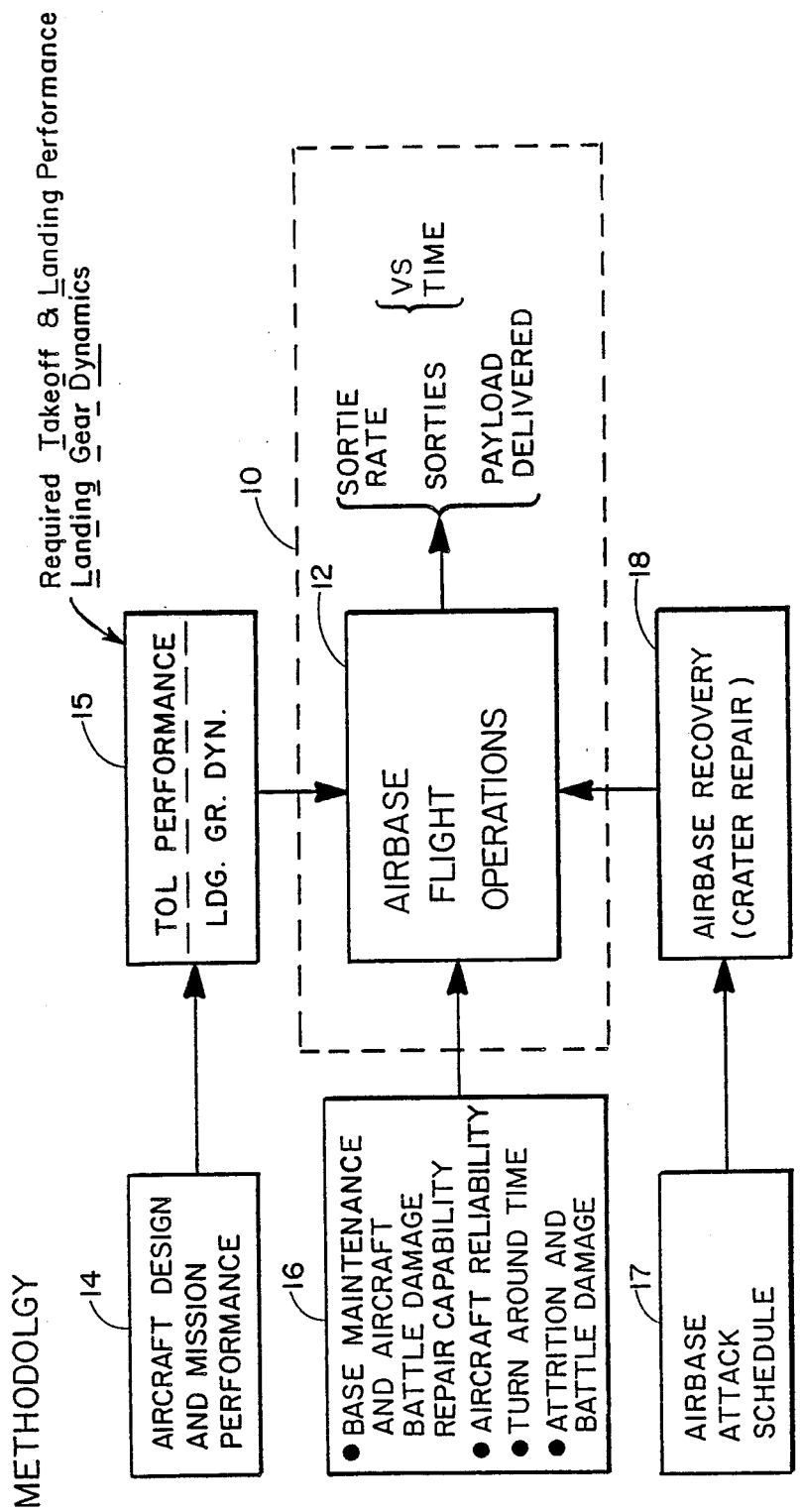
FIG. 1 is a block diagram which shows how the different areas such as aircraft supportability, maintainability, and survivability and airbase survivability come together to influence the sortie generation capabilities of an aircraft.
Figure 2:
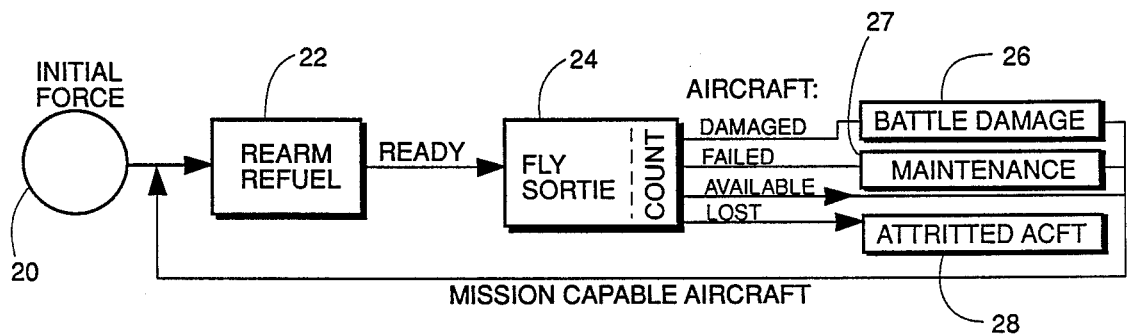
FIG. 2 is a diagram which illustrates this process in a logical sequence.
Figure 3:
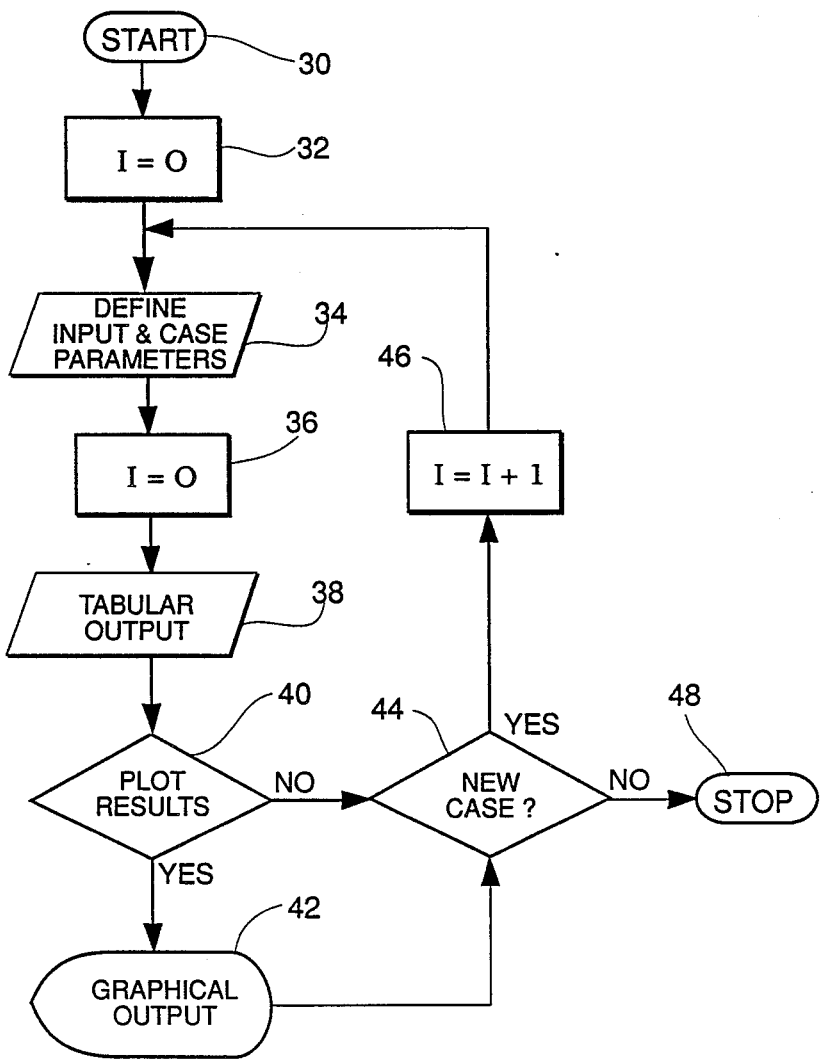
FIG. 3 and FIGS. 3a–3g inclusive are flow charts of the computer program.
Figure 3A:
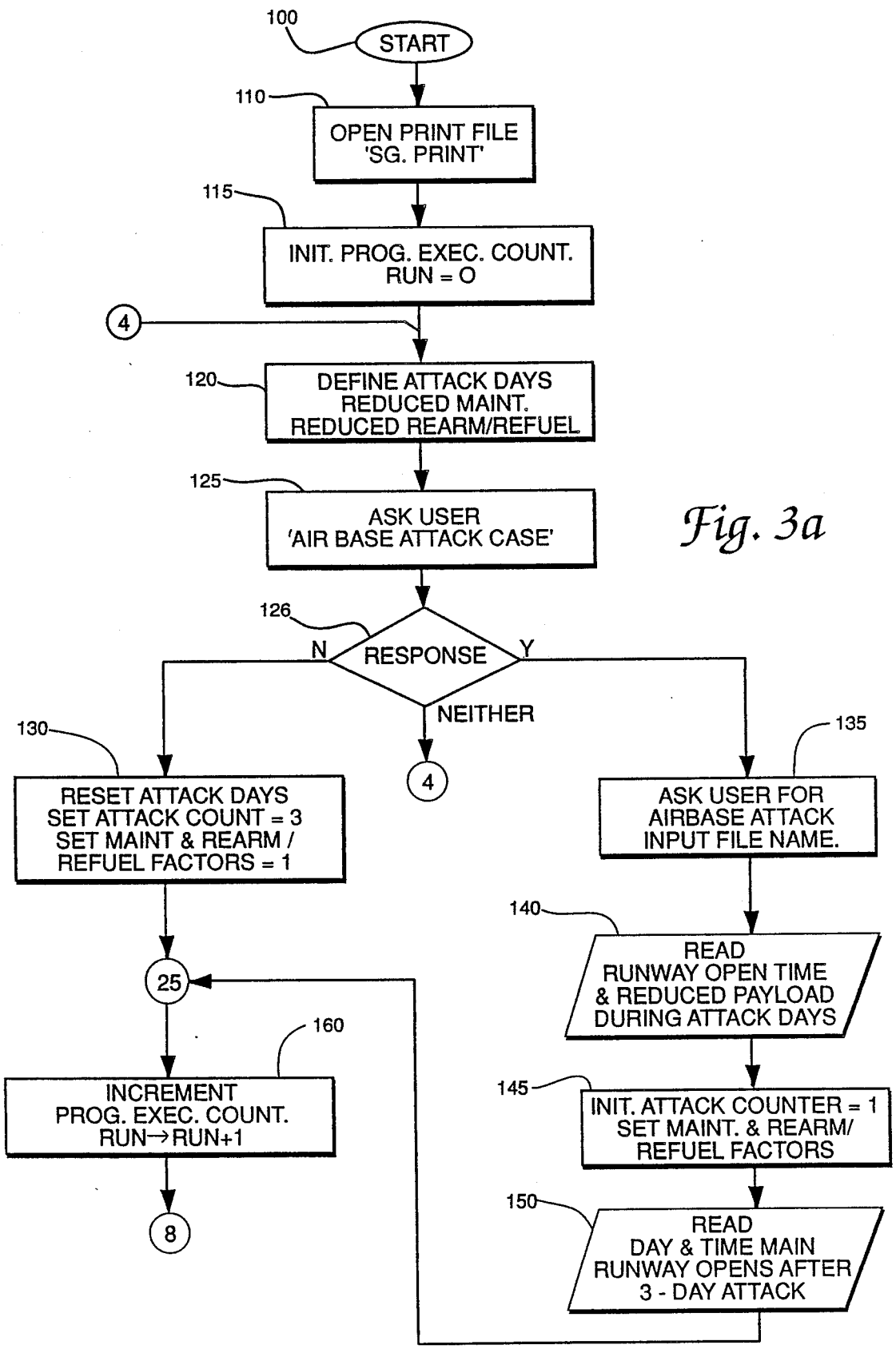

During the analysis phase of a vehicle design, different features are critiqued for their impact on performance: in particular, the sortie generation capabilities of the aircraft. FIG. 1 shows how the different areas such as aircraft supportability, maintainability, and survivability and airbase survivability come together to influence the sortie generation capabilities of the aircraft. FIG. 2 illustrates this process in a logical sequence. An aircraft force is armed and fueled for a mission. The mission is flown during which the aircraft are either damaged, attrited, returned for maintenance, or are immediately placed in the mission capable pool. This mission capable pool of aircraft is then armed and fueled for the next sortie. The Airbase Sortie Generation Analysis Model (ABSGAM) simulates the process. FIG. 3 is a flowchart of the computer program. FIGS. 4 and 5 illustrate an example of the tabular and graphical outputs of the program, respectively.

In FIG. 1, the Airbase Sortie Generation Analysis Model (ABSGAM) is represented by the dashed block 10, which models the airbase flight operations represented by block 12. The output includes sortie rate, number of sorties and payload delivered versus time. Inputs for the model include the aircraft design and misson performance requirement (block 14) which provides input to block 15 on required takeoff and landing performance, and landing gear dynamics. Block 16 shows base maintenance and aircraft battle damage repair capability, aircraft reliability, turn around time, and attrition and battle damage. Block 17 provides the airbase attack schedule, used as input to block 18 on airbase recovery, such as crater repair. Blocks 15, 16 and 18 supply inputs to the block 12.

Note that the landing gear system is analyzed for its dynamic load response to a runway surface roughness outside of the ABSGAM. A particular design will have a maximum surface roughness that it can traverse without exceeding the limit load capability of the aircraft. The time to repair a runway is a direct function of this roughness level (Civil Engineering standards for repair). Thus, for a given airbase attack scenario, the times to first damage and then repair of a runway can be calculated. These two times are input into the ABSGAM model, and represent both the landing gear capability and the Civil Engineering repair capability.

Landing gear characteristics were required for a special case in a study. Generally, other design characteristics would be used. The exact characteristics would depend upon the particulars of the study being performed.

1.0 INTRODUCTION

A program listing in FORTRAN is included as part of this patent application.

The following description is taken from a technical memorandum AFWAL-TM-87153 (hereinafter "said tech memo"-a copy in draft form is included with this patent application as filed, and is hereby incorporated by reference), which is the user's manual for a computer model developed to predict the maximum sortie generation capability of aircraft operating from a typical USAF air base. The model, entitled "Air Base Sortie Generation Analysis Model (ABSGAM)," allows the user to easily change various input parameters to evaluate their impact on: (1) aircraft sortie rates, (2) cumulative sorties generated, (3) payload launched, and (4) material/personnel required to support the air base operation. ABSGAM stimulates: (1) an air-base-attack and recovery, (2) reduced payload operations, (3) reduced maintenance capability, (4) extended turn-around time, and (5) aircraft attrition (both air and ground). Program output is available in graphical and tabular form.

The purpose of this project was to assess the military worth of some selected, advanced technologies on future aircraft designs and subsystems. These technologies include five advanced landing gear concepts, onboard chemical-biological detoxification equipment, and low-profile crew modules. A series of advanced, deep-strike fighters were designed to evaluate the various technologies. The sortie generation capability of the strike fighter operating with each of five landing gear candidates was analysed. ABSGAM was developed to enhance this analysis.

The above paragraph is specific to one study. The computer program is generalized so that other technologies can be evaluated (not just landing gear).

2.0 SORTIE GENERATION MODEL

The sortie generation model is based on several assumptions which are "hard-wired" into the computer code. This approach minimizes the input required by the user and simplifies the program. If desired, the program could easily be modified to allow these values to be user-defined. However, this modification would complicate the program and the input required by the user. The "hard-wired" values were defined by "off-line," or hand studies. These studies included development of the maintenance cycles and the air-base-attack and recovery modes. Other input variables are user-defined and include force size, mission time, required mission fuel, and the desired engagement length.

The model stimulates an entire mission (sortie) cycle for a user-defined number of aircraft. A sortie is flown, during which some aircraft are attrited or damaged. After the mission, aircraft enter maintenance and repair cycles if necessary, while the mission-capable aircraft are rearmed/refueled for the next sortie. The model simulates a maximum 30-day flight operation. FIG. 2 represents the basic sortie generation model. The initial force is shown as a circle 20. At the beginning of a sortie, block 22 shows the step of rearming and refueling and when ready going to block 24 for flying the sortie. The model makes various counts and supplies data on number of aircraft damaged to block 26 for battle damage repair, number of aircraft failed to block 27 for maintenance, number of aircraft available, and number of aircraft lost to block 28 for attritted aircraft. From this data the number of mission capable aircraft is determined for the next sortie.

2.1 CASE 1-NO AIR-BASE-ATTACK

A normal flying day of 0600 to 2000 hours was defined. At 0600, all mission-capable aircraft enter a rearming/refueling cycle. (This pre-flight cycle was defined as the first event of the day in order to simplify the program). The user inputs the mission air time, the fuel required per sortie, and the aircraft weapons load. The program calculates the time required to prepare (rearm-/refuel) the aircraft for the mission. This calculation is based on six (6) rearming stations (typical for an air base), a rearming time of ten (10) minutes/aircraft (estimated for advanced weapons and loading techniques), six (6) refueling stations (typical for an air base), a refueling rate of 600 gallons/minute (one of two primary flow rates used by NATO), and a three (3) minute taxi time between the rearming and refueling stations. These hard-wired values were fixed for this study, but the program could be modified to accept values input by the user.

After all mission-capable aircraft have completed the rearm/refuel cycle, a mission is launched with all available aircraft. During the mission, aircraft are attrited due to combat at a rate defined by the user. (The user defines a combat attrition rate for each of the 30 days).

Aircraft that survive the mission enter a damage repair cycle, a maintenance cycle, or are immediately declared mission-capable. The number of damaged aircraft to attritted aircraft is assumed to be a 3:1 ratio. The damaged aircraft require 24 hours to repair before becoming mission-capable. The number of aircraft requiring general maintenance is determined by the user-defined critical mean time between failure (MTBF). Aircraft requiring maintenance enter a 2 hr, 8 hr, 24 hr, or extended (10-day) repair cycle. Of the aircraft entering maintenance, 39% require 2 hours of maintenance before being declared mission-capable, 39% require 8 hours, 19% require 24 hours, and the remaining 3% require 10 days of maintenance. These percentages were developed through a comparison of MTBF's for the existing U.S. force structure and the maintenance required by each type of aircraft. Maintenance is performed 24 hrs/day. The mission-capable aircraft are added to the aircraft returning from maintenance (required after previous missions) to determine the total number of mission-capable aircraft available for the next mission cycle. The rearm/refuel time is calculated for this sum of aircraft. If the aircraft can be armed and fueled and a mission launched before 2000 hrs, the model will execute the sortie even though the aircraft may return well after the set day end (2000 hrs).

2.2 CASE 2-With Air-Base Attack

ABSGAM has a built in air-base-attack and recovery capability. When this capability is used, the model simulates two 3-day attack sequences on the base. The base is attacked and forced to close at 0530 on each of the six (6) attack days. At a user-specified time for each day, a taxiway is opened as a minimum operating strip (MOS). The MOS has limited operational capability; however, and missions launched from this strip have a reduced payload per aircraft. This reduced payload allows the aircraft to take off within the available length and smoothness of runway surface. For example, the level of runway quality needed for flight operation is dependent upon the landing gear concept being evaluated in this case. When the main runway is reopened at a later, user-defined time, full payload is resumed. For each attack sequence, the user inputs the times (for each of the 3 days) that the taxiway is opened, the reduced payload for each day, and the day and time that the main runway is reopened after the 3-day period. The attack days hardwired into the program are days 1, 2, 3, 13, 14, and 15. The program could be modified to accept user-defined attack days; however, reprogramming the 3-day attack concept would require a larger modification of the program. This attack and recovery scenario was built up from existing threat data and its postulated attack concepts.

The program also accounts for the effects of an attack on maintenance and rearm/refuel times, and includes ground attrition due to the attack. Ground attrition due to the attacks is calculated using 3%, 1.5%, 0.5%, 1.5%, 0.75%, and 0.25% of all remaining aircraft at the beginning of days 1, 2, 3, 13, 14, and 15, respectively. No maintenance is performed on aircraft from the time the base is attacked on the first day of a 3-day attack period until the main runway reopens. It is assumed that all ground personnel (except preflight crews) would be devoted to recovering the runways. The maintenance cycle times are then increased by ⅓ after the main runway reopens following the first 3-day attack and are doubled (2X normal) after the main runway reopens following the second 3-day attack. Thus the 2-hr maintenance cycle may become a longer cycle after an attack. The user should note that the headings on the output will not change. The user should realize that, after the first attack, the 2-hr maintenance cycle is actually longer than two hours. The rearm/refuel time is doubled (2X normal) when the main runway is closed. It is increased by ¼ when the main runway reopens after the first 3-day attack and is increased by ½ (1.5X normal) when the main runway reopens after the second 3-day attack. These increases reflect the damage to support facilities sustained in the attacks.

2.3 SIMPLE PROGRAM FLOWCHART

The simple flow chart of FIG. 3 shows a start block 30, followed by setting a run number counter to I=0 at block 32. Block 34 shows the input to define input and case parameters. At block 36 a run is executed, followed by tabular output at block 38. At decision block 40 the user is given the option to plot results, and if the response is yes, the graphical output is produced at block 42.

ABSGAM offers the user the option of restarting after a run is completed. For example, after a run, the user can restart the program, change any number of input parameters or files, and re-execute. After each run, the user has the option of plotting the results of any combination of previous runs on a single graph. This capability allows the user to perform trade studies on the input parameters, compare peacetime/wartime scenario results, or compare different aircraft configurations, and then display the different results of several runs on a single plot. The program is dimensioned to allow the user up to 10 runs per program execution. This restart option is illustrated in the simple program flowchart at block 44. another run is chosen, the run number is incremented at block and then returned to block 34 for input. If this was the last run, the program goes from block 44 to stop at block 48.

3.0 PROGRAM DESCRIPTION AND USAGE INSTRUCTIONS

A more detailed flow chart is shown in FIGS. 3a–3g, corresponding to the FORTRAN listing at the end of this specification. The connectors in circles of the flow chart correspond to line numbers in the listing, or to connectors between pages. On the first two pages, the program listing defines a list of variables and allocates memory, represented in FIG. 3a by the Start block 100.

At block 100, the flow chart shows opening the print file 'SG.PRINT', which is file 9 in the listing. This file will collect all non-graphics screen output and user inputs. A file 1 is used in the listing to read input from the keyboard and to write or echo to the monitor screen.

Block 115 shows initialization of the program execution counter (RUN) to zero.

Block 120 shows the definition of days when the base is under attack. Missions may be skipped on these days. Block 120 also shows that values are provided for the reduced maintenance factor array and the reduced rearm/refuel array for the two three-day attacks. Section 2.2 above gives further information relative to this block.

The program at block 125 asks the user if this will be an air-base-attack case.

AIR BASE ATTACK CASE (Y,N)

This option is provided on every run, enabling the user to run an air-base-attack case and non-air-base-attack case and to compare the results within the same execution of the program. The user responds with either a Y or an N.

If the response at block 126 is N, as shown at block 130, the program sets all attack days to zero for a non air base attack case, and sets an attack counter (A) to three. The reduced maintenance and rearm/refuel factors are set to one. The operation then goes to line 25.

If the response is neither N nor Y, the operation returns via line 4 to block 120 to repeat the request.

If the air-base-attack case is chosen, the program will at block 135 prompt the user for an air-base-attack input filename.

INPUT AIR BASE ATTACK FILENAME

The user responds with the name of a directory file. The length of this filename can be up to nine (9) characters. The user must generate this file and will typically have an air-base-attack file for each aircraft configuration or attack scenario being studied. This file includes an air base open time and reduced payload capacity for each of the six days the base is under attack, and the day and time that the main runway reopens after each 3-day attack period. Each line of data is unformatted, and the file contains eight (8) lines, as in the following example:
2153 2
1914 2

1914 2
2153 2
1914 2
1914 2
6 0830
18 0830

At block 140, the program reads the runway open time from the identified input file, and reads the runway open time and reduced payload for missions completed during the attack days. At block 145 the program initiates the attack counter (A) and takes the reduced maintenance and rearm/refuel factors from the arrays. At block 150, the program reads the day and attack time when the main runway opens after each 3-day attack, and then converts these times to minutes from day 1 time 0000 in military format.

The attacks occur on days 1, 2, 3, 13, 14, and 15 (this is hard-wired into the program). Using the air-base-attack file shown above, the base reopens at 2153 on days 1 and 13, and at 1914 on days 2, 3, 14, and 15. (The program always assumes the base is attacked and closes at 0530 on each of the six attack days). Any missions completed on these days have a reduced payload capacity of two weapons. (The full payload capability is included among the main input parameters.) The main runway reopens on days 6 and 18 at 0830. The reduced payload for the third day of each 3-day attack is used until the main runway reopens, at which time full payload capability is resumed.

Figure 3B:
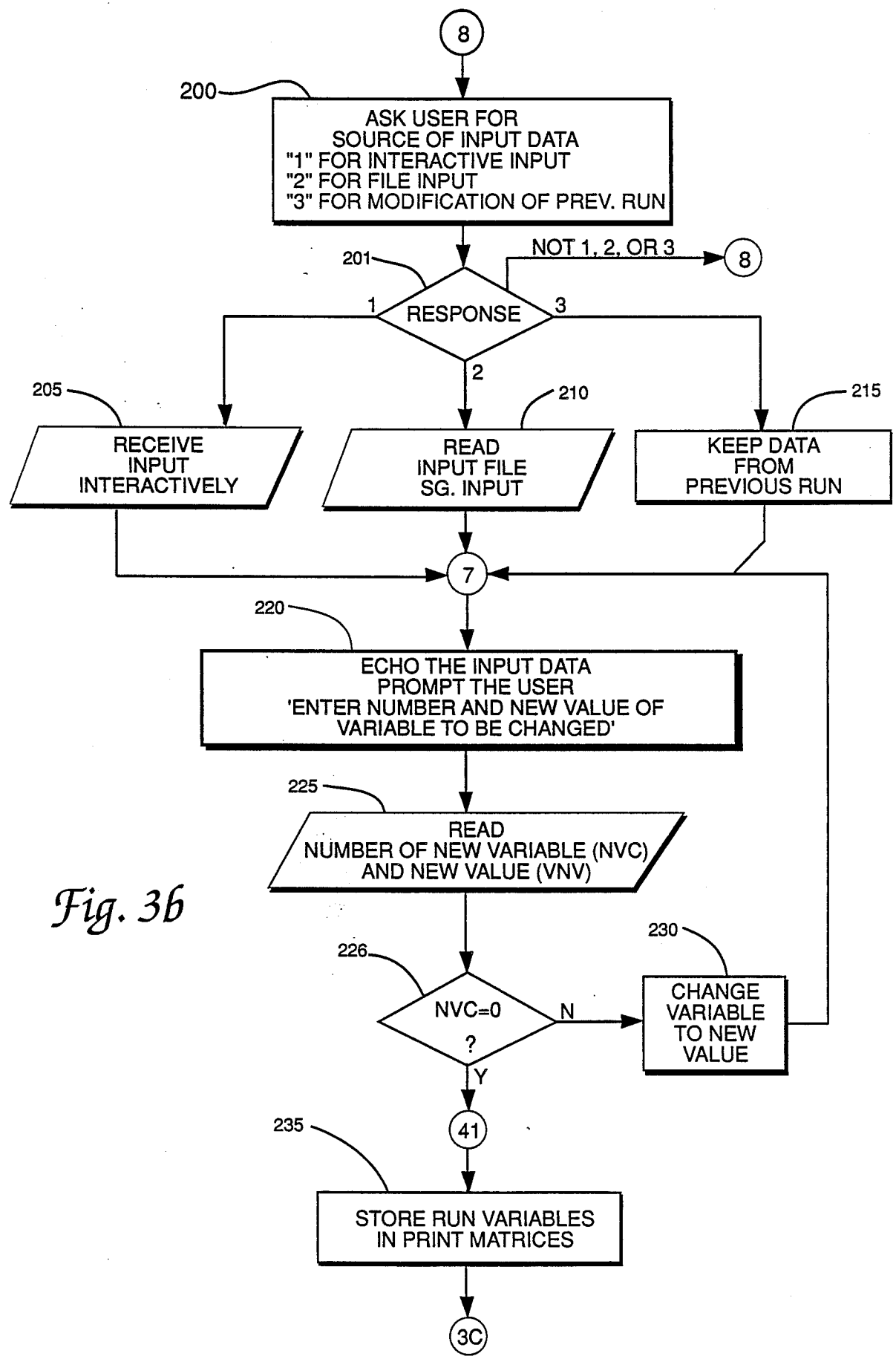
Figure 3C:
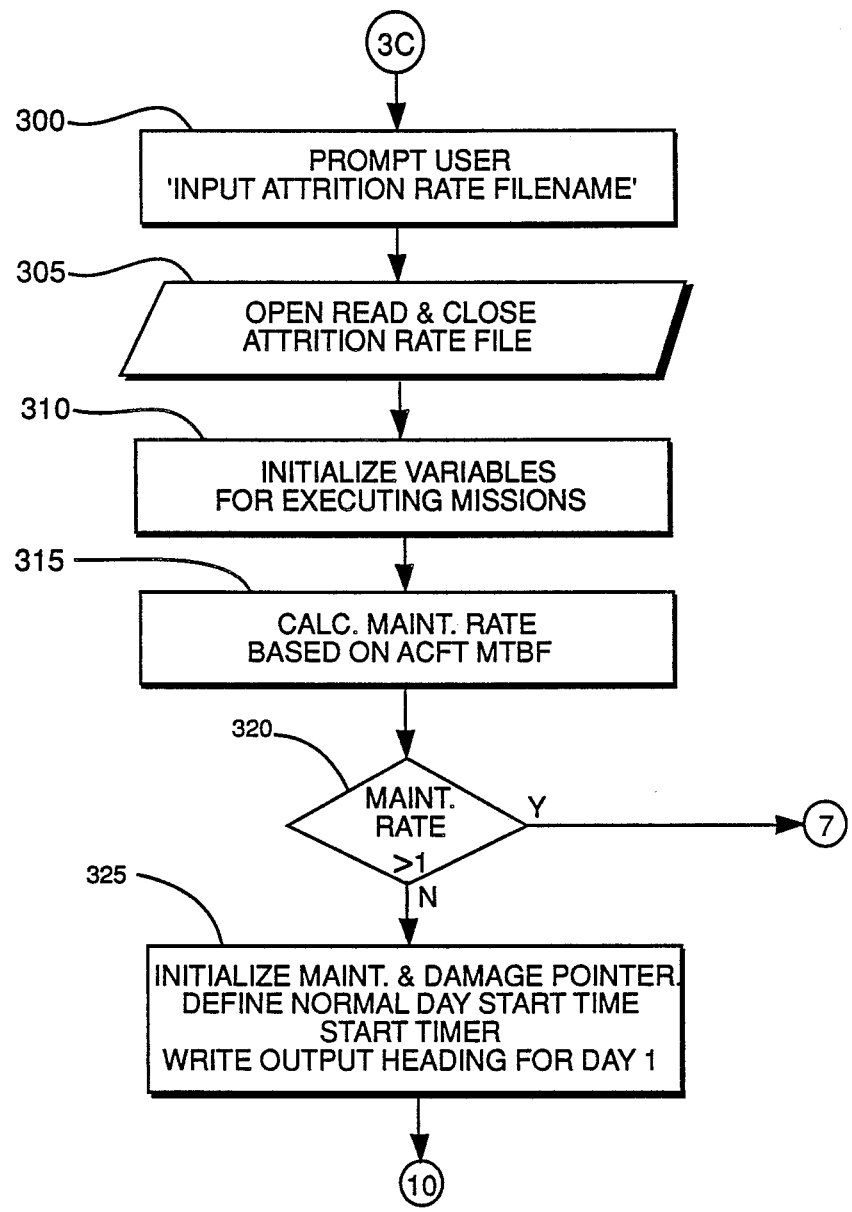

For both the not attack and attack cases, the program goes via line 25 to block 160 of the flow chart, to increment the program execution counter, and then via line 8 goes to block 200 of FIG. 3b.

The user has three options when providing the main input parameters for the program. The program at block 200 asks the user whether these parameters will be entered interactively, through file input, or by modifying the input of a previous run.

INPUT 1 FOR INTERACTIVE INPUT
INPUT 2 FOR FILE INPUT
INPUT 3 FOR MODIFICATION OF PREVIOUS RUN

Block 201 of the flow chart indicates the response.

If the user chooses interactive input (1), the program at block 205 prompts him as follows:
INPUT NUMBER OF AIRCRAFT IN INITIAL FORCE
INPUT ENGAGEMENT LENGTH IN DAYS
INPUT MISSION FLIGHT TIME IN MINUTES
INPUT AIRCRAFT MTBF IN HOURS
INPUT FUEL REQUIRED (LBS FUEL/SORTIE)
INPUT MAINTENANCE MAN-HOUR RATE (MMH/FH)
INPUT MAX PAYLOAD (NO. OF WEAPONS)

For each prompt, the user should enter a value for that variable.

If the user selects the file input option (2) the program goes to block 210 and, the file "SG.INPUT" must be located in the directory. This file consists of one line of unformatted data, as follows:

72 30 90 7.5 26000 25. 10

These values correspond to:

(1) number of aircraft in the initial force
(2) engagement length in days (maximum of 30)
(3) mission flight time in minutes
(4) aircraft critical mean time between failure (MTBF) in hours
(5) fuel required in 1 lbs fuel per sortie
(6) maintenance man-hours per flight hour
(7) maximum payload capacity per aircraft If the user chooses to modify the previous run, as shown at block 215, the input data for the previous run is retained, so that the user may change the parameter(s) desired. In all three options the program goes via line 7 to block 220, where, the input data is echoed to give the user a last chance to change any parameter before beginning a run.

ENTER NUMBER AND NEW VALUE OF VARIABLE TO BE CHANGED
(EXL 1.72)
1-NUMBER OF AIRCRAFT IN INITIAL FORCE-30
2-ENGAGEMENT LENGTH IN DAYS-30
3-MISSION FLIGHT TIME IN MINUTES-90
4-AIRCRAFT MTBF IN HOURS-7.500
5-FUEL CONSUMPTION RATE (LBS FUEL/SORTIE)-26000
6-MAINTENANCE MAN-HOUR RATE (MMH/FH)-25.0
7-MAX PAYLOAD PER MISSION (NO. OF WEAPONS)-10
0-(ANY NUMBER) DATA IS CORRECT?

At block 225, the program then reads the number (NVC) and value (VNV) and at block 226 checks whether the number (NVC) is zero. If not the new value is entered at block 230, and the flow returns via line 7 to block 220.

After the input of the main parameters is completed, the user types O followed by any number to continue. The program goes via line 41 to block 235, to store the run variables in print matrices. The program at block 300 of FIG. 3c then prompts the user for a filename containing daily combat attrition rates.

INPUT ATTRITION RATE FILENAME

The length of the attrition rate filename can be up to 12 characters. The user could save any number of attrition files (peacetime, wartime, high, low, etc.) in the file directory and run comparison studies by making similar runs with different attrition files. At block 305, the program opens, reads and closes the attrition rate file. An attrition rate file consists of six (6) lines with five (5) values per line (unformatted) as shown.

| .0465 | .0460 | .0450 | .0434 | .0410 |
|-------|-------|-------|-------|-------|
| .0370 | .0325 | .0260 | .0205 | .0170 |
| .0141 | .0123 | .0110 | .0097 | .0088 |
| .0080 | .0075 | .0070 | .0065 | .0062 |
| .0059 | .0058 | .0057 | .0056 | .0055 |
| .0055 | .0055 | .0055 | .0055 | .0055 |

The 30 values above are percent attribution rates for each of the 30 days in the simulation. These values, when multiplied by the number of aircraft flying a mission, provide the number of aircraft attrited during that mission.

At block 310, the program will initialize variables for cumulative attrition, daily attrition, missions skipped due to an attack and no print flags, day counter, daily sorties, cumulative sorties, fuel consumed and maintenance man-hours per flight-hour, current payload capacity, cumulative payload, daily payload, available aircraft, and ground attrition rates.

At block 315, the program calculates the maintenance rate as the flight time divided by the mean time between failures in minutes (MAINRAT=FLTIME/MTBF*60).

If the aircraft mean time between failures is less than the mission length, aircraft will be gained during the maintenance cycle. To eliminate this problem, the program at block 320 checks the maintenance rate, and if it is greater than one (input MTBF is less than the mission length), the flow returns via line 7 to block 220 in FIG. 3b for the MTBF to be set equal to the mission length. If the MTBF is equal to or less than one, the program goes to block 325.

A maintenance and damage pointer is initialized at LM(I)=1. for I=1 to 5. A normal day start time is defined as MSTART=360. A timer is started (TIME=MSTART). The program writes an output heading for the first day.

The program then begins executing the missions and outputs the results in a table and summary for each day of the engagement.

3.1. Main Loop

In FIG. 4d at block 400, the program then begins the main loop to be executed for every mission. The mission number MI is initially set to one. The maximum value of 350 is greater than would occur in any simulation run.

At block 405 a check is made as to whether the number of available aircraft variable is less than zero, and if so, is set to zero.

At block 410, the attack counter A is checked whether it is less than or equal to two (this counter was either set to three at block 130 for non-attack cases, or initially set to one at block 145 for attack cases). If the base has been attacked, a check is made at block 415 as to whether the main runway is ready to reopen by a comparison of the current time against the variable for time of day the main runway opens after each three-day attack. A negative result from either of blocks 410 or 415 causes the program to go to block 425.

If the base has been attacked and the main runway is ready to reopen, the flow chart goes to block 420, to set the payload to full capacity, increment the attack counter, and tell the user that the main runway is now open before executing the next mission.

At block 425, a variable is set for the next engagement day; and at block 430 this variable is checked to determine if it is one of the six attack days built into the program. If the base is under attack, a check is made at block 435 to see if a flag has been set indicating that missions have already been skipped. If not the operation goes to block 440 to set variables to reduce the payload capacity, calculate the ground attrition and update the available aircraft. A mission skip routine is executed, and the mission skip flag is set (so same missions are not skipped again next time through the loop. The program will change the mission number and no print option if all missions are skipped this day. Then at block 445, the program checks the time to determine if it is the end of the day, and if so goes to line 32. If block 430 indicates that it is not an attack day, block 435 indicates that missions have already been skipped, or block 445 indicates that it is not the end of the day, the operation goes to FIG. 3e.

At block 500, the program calculates the ground time for rearming and refueling, and increments the time. At block 505, if it is the end of a day, the operation goes to line 32.

If it is not the end of day, the program proceeds to block 510 to run a mission, which comprises calculating attrited aircraft and the number of sorties; incrementing daily sorties, payload, and attrition; calculating damaged aircraft, surviving aircraft, aircraft requiring maintenance, and mission capable aircraft. The program also determines the time when damaged aircraft and aircraft requiring maintenance after the next mission will be available. It reduces the number of available aircraft by the number of damaged aircraft and aircraft requiring maintenance. There are also time calculations and updating.

At block 515, the program will test the pool of aircraft in maintenance and damaged aircraft to determine which aircraft will be available for the next mission. The number of available aircraft is increased and a pointer is reset. There is a calculation of the number of aircraft returning from maintenance; and a calculation of the mission start time (converted to military time).

The operation now goes via line 32 to block 520 to again check for the end of day. If yes, then at block 530 the program will increment a day counter, reset the mission skip flag, increment the time, test the pool of available aircraft, and add to the number of aircraft available.

At a decision block 535 a check is made for an attack day, and if yes goes to block 540 to increment an attack counter and set attack variables.

Figure 3D:
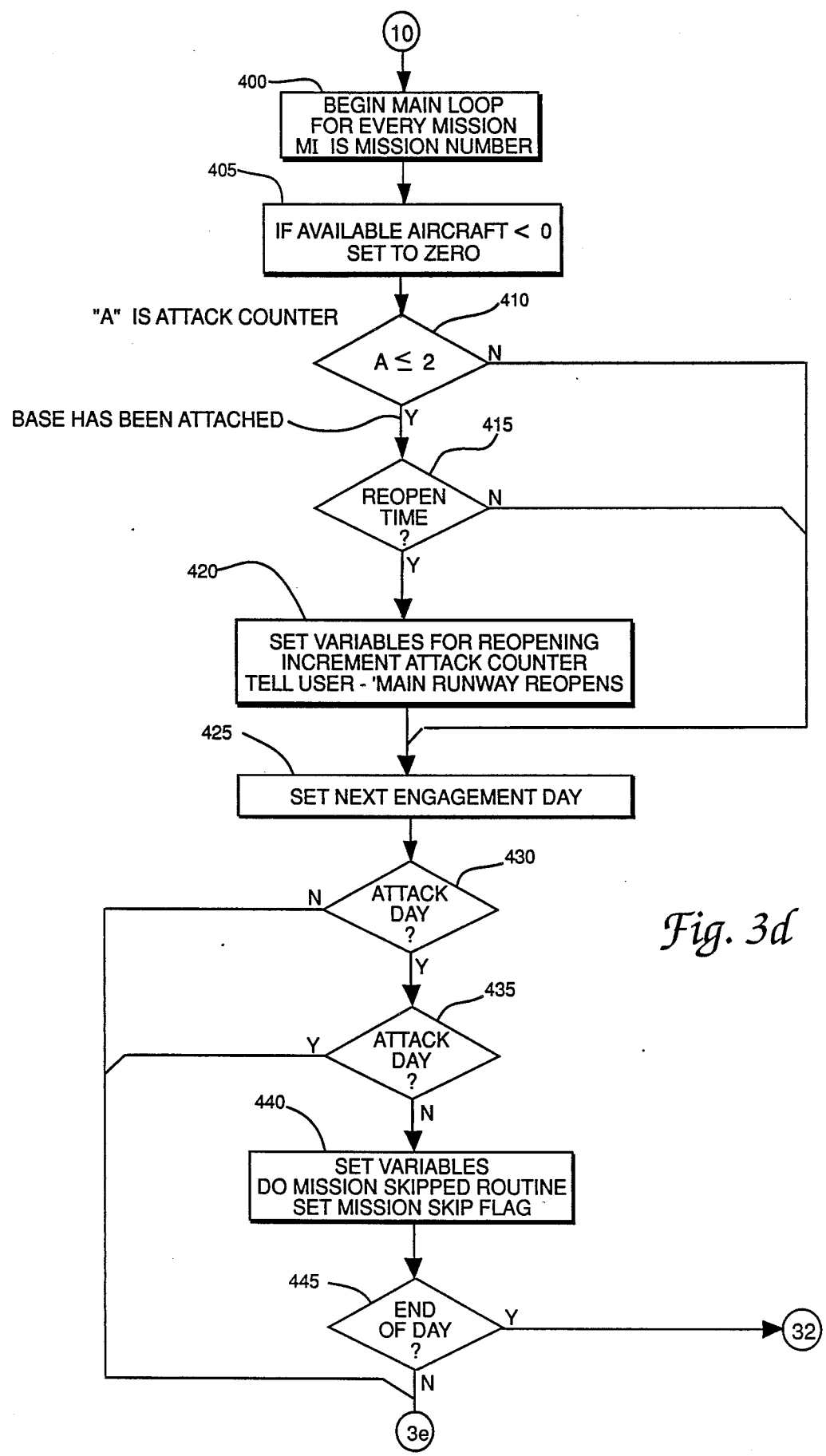
Figure 3E:
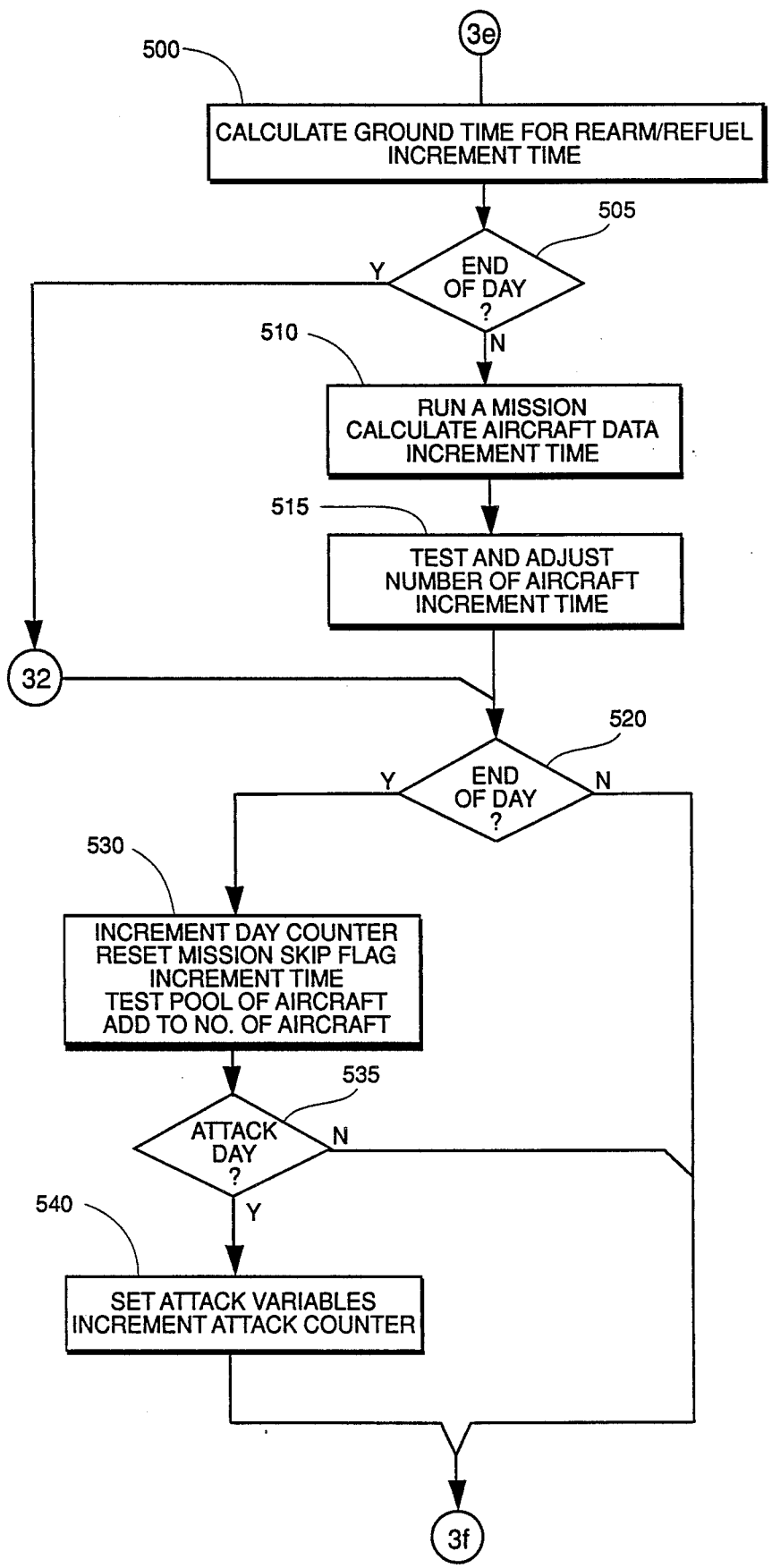
Figure 3F:
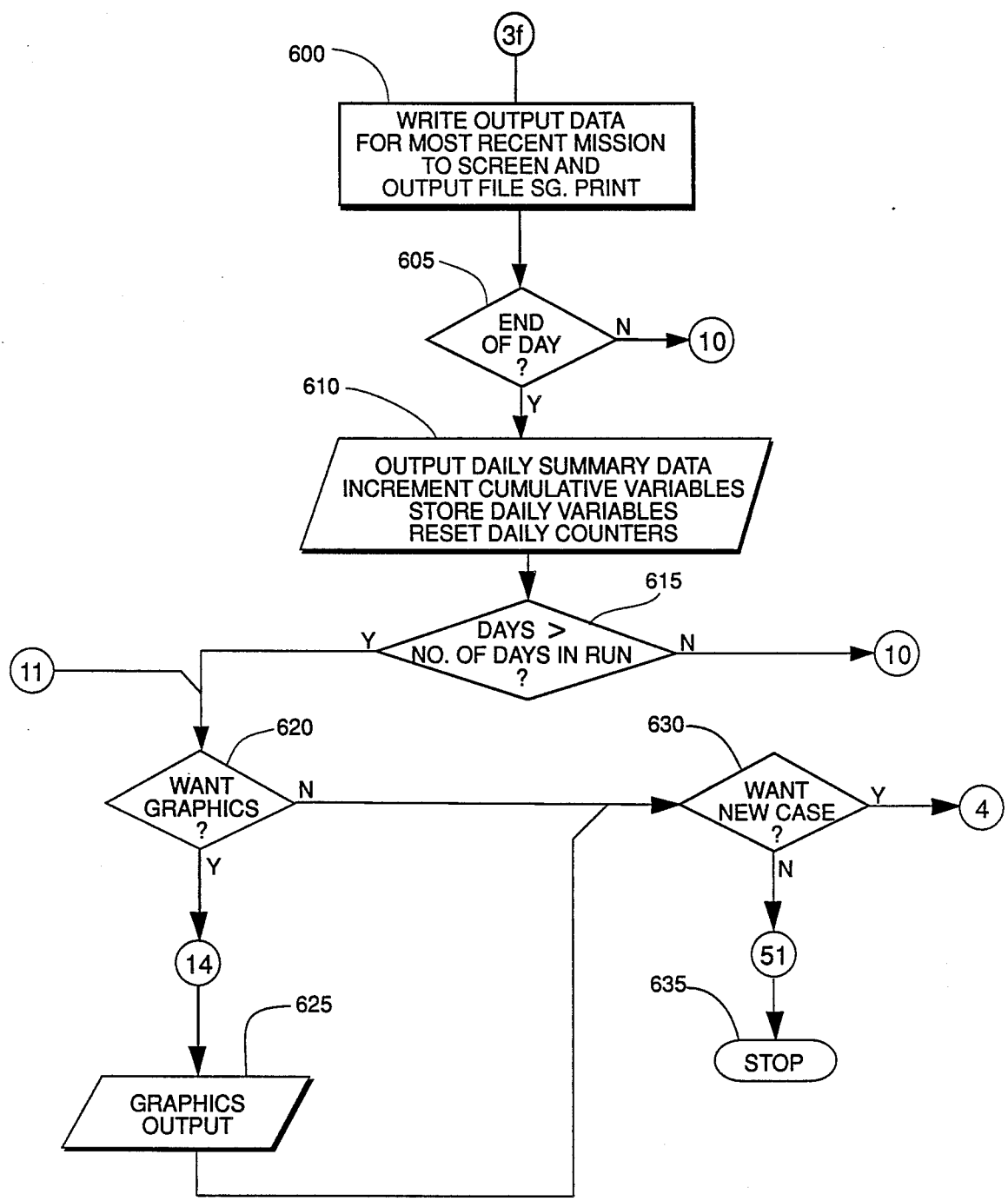

A no response from block 520 or block 535, or completion of the operations of block 540, takes the flow to FIG. 3f.

At block 600, all data generated by the most recent mission is written as output to the screen and to the output file.

At decision block 605, if it is not the end of day, the program via line 10 goes to block 400 of FIG. 3d to increment the mission counter (MI) and begin the main loop for the next mission (the DO 10 loop begins on page 8 of the listing and the 10 CONTINUE line is at the middle of page 14). If the response from block 605 is yes, operation goes to block 610.

After the last mission of the day, the program writes to the screen and to the output file the daily and cumulative attrition; increments the cumulative sorties and payload; outputs the daily and cumulative sorties; outputs the daily and cumulative payload; saves the values for daily and cumulative sorties, daily and cumulative payload, daily and cumulative attrition, and available aircraft for the beginning of the next day. It calculates and saves the daily and cumulative fuel consumption, and daily and cumulative maintenance man-hours. It resets the daily counters for attrition, sorties, payload, and ground attrition to zero.

Examples of daily outputs for an attack day and a non-attack day are shown in FIG. 4. For each completed mission, the output includes the following:

(1) mission start time
(2) aircraft available to fly the mission
(3) aircraft attrited during the mission
(4) aircraft damaged during the mission
(5) total number and breakdown of aircraft entering the four (4) maintenance cycles after the mission
(6) the number of aircraft returning from maintenance during this mission that will be available for the next mission (7) the number of aircraft that flew this mission and require no maintenance before flying again The sum of the last two columns equals the available aircraft for the next mission. The last value in the RETN ACFT column represents aircraft that will return from maintenance overnight. A daily operations summary with cumulative totals is provided after the mission data table.

At a decision block 615 of FIG. 3f, the number of the day is compared to the number of days for the run, to determine if this is the end of the run. If not, operation returns via line 10 (to FIG. 3d) to run the next mission.

After the output for the last day of the engagement, the program at block 620 gives the user the choice of plotting the results of this run and/or any previous runs. (Up to 10 runs may be plotted).

DO YOU WISH TO PLOT RESULTS (Y,N)

If the user does not want to plot at this time (indicated by N), the program at block 630 gives the user the option of restarting the program or stopping (block 635).

RESTART (Y,N)

Figure 3G:
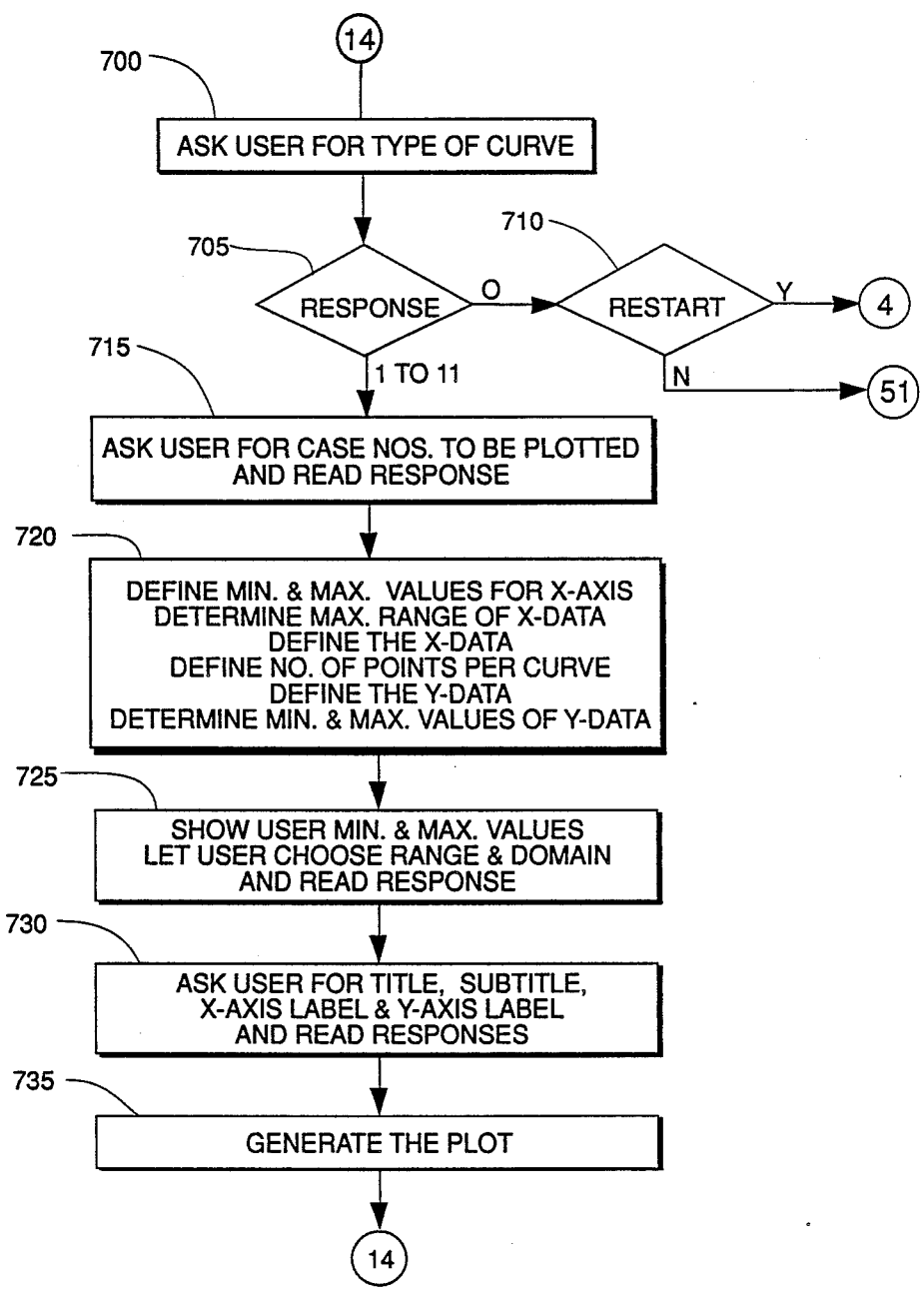

If the user decides to plot (Indicated by a Y response above), the program goes via line 14 to block 625 for the graphics output operation shown in more detail in FIG. 3g. The program calls several subroutines, which are part of a graphics software package. At block 700, the program gives the user eleven (11) types of curves from which to choose:

1-DAILY SORTIES
2-CUMULATIVE SORTIES
3-AVAILABLE AIRCRAFT
4-DAILY ATTRITION
5-CUMULATIVE ATTRITION
6-DAILY FUEL CONSUMPTION
7-CUMULATIVE FUEL CONSUMPTION
8-DAILY MAINTENANCE MAN-HR
9-CUMULATIVE MAINTENANCE MAN-HR
10-DAILY PAYLOAD
11-CUMULATIVE PAYLOAD
0-QUIT
INPUT NO OF CURVE TYPE

If the user chooses the QUIT option (0), the RESTART (Y, N) prompt (block 710, like block 630) reappears. If the user selects a type of curve, the program at block 715 prompts the user for run numbers to be plotted. A run summary matrix is displayed to help the user with this input.

ENTER RUN NOS. TO BE PLOTTED

The user responds with the run numbers (previous runs and/or most recent run), separated by commas, to be included in the plots. If the number of runs to be plotted is less than 10 (which will usually be the case), the program will give a MORE prompt. If the user does not wish to have any more runs included, hitting the RETURN key will continue the program. The program at block 720 will define the minimum and maximum values for the X-axis, determine the maximum range of the X-data to be plotted, define the X-data, define the number of points per curve, define the Y-data on the curve chosen by the user, and determine the minimum and maximum values of the Y-data. At block 725 the program shows the user the minimum and maximum values to be plotted on the abscissa and ordinate.

THE RANGE IS XXX. XXX. THE DOMAIN IS XXX. XXX. INPUT XMIN, XMAX, YMIN, YMAX

The user then inputs the minimum and maximum abscissa and ordinate values to be used to label the plot. (There are always 10 divisions on each axis).

The program at block 730 then prompts the user for a title, subtitle, and x- and y-axis labels.

INPUT TITLE
INPUT SUBTITLE
INPUT X-AXIS LABEL
INPUT Y-AXIS LABEL

The length of each of the titles and labels is limited to 40 characters.

After the titles are input, the program at block 735 generates the plot. An example is shown in FIG. 5. The program pauses after the plot is completed to allow the user a chance to review the plot and make a hardcopy if desired. The user needs to hit the RETURN key to continue after the plot is completed. The program returns to the curve type menu via line 14 to block 700, allowing the user to generate a different plot.

4.0 Program Input/Output and Execution on the Prime Compute

ABSGAM was written for the AFWAL/FIAD PRIME 750 minicomputer, and uses Tektronics Plot 10 IGL Graphics subroutines for the plotting capability.

The program requires several files to be located in the user's directory. These files include the executable version of the program, several small input files, and one output file. ABSGAM.SEG is the executable version of the program. Input files required are: SG.INPUT (only required for the file input option for the major input parameters), an attrition rate input file with a filename up to 12 characters (required in all cases), and an air-base-attack input file with a filename up to nine (9) characters (only required to run an air-base-attack simulation). All non-graphic output (prompts, responses, and program results) that is printed at the terminal is written to SG.PRINT. This provides the user with a hardcopy of the entire execution.

A simple CPL (Command Procedure Language) file would be useful for executing the program. A CPL file could be as simple as:

DELETE SG.PRINT
SEG ABSGAM.SEG

If this file is called SG.CPL, the user would type R SG to delete the old output file (SG.PRINT) and execute the program. The new output would overwrite the old output in SG.PRINT if the file was not deleted; however, if the new output is shorter than the old output, part of the old output would remain at the end of the new SG.PRINT file. Therefore, it is wise to delete the old SG.PRINT file before executing the program.

ALTERNATIVES

The program was originally developed to investigate candidate landing gear technologies. It can also be used to assess other technologies which contribute to aircraft sortie generation (flaps, thrust reversers, V//STOL concepts, battle damage repair, survivability/vulneability features) or to assess airbase survivability features (defense, hardening, redundancy, dispersion, tactical location, recovery). Another alternative use is as a primary tool in a "system" study such as base/aircraft profile, land battle support, logistical requirements, etc.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

The program could be used in the defense industry, and could be adapted for similar design studies. In addition, it could be used to evaluate commercial transport systems such as trucking, shipping, airline/cargo, space transport, and auto rental; either the evaluation of existing vehicles or of new designs.

```
USER: ADMIN                                      -AT

<REV194>ADMIN>SG.ABAF.F77
```

[ASCII art banner spelling "WUMPF7" or similar]

```
LABEL: PRT002 -FORM

PATHNAME: <REV194>ADMIN>SG.ABAF.F77
FILE LAST MODIFIED: 86-09-11.13:51:56.THU

SPOOLED:  86-09-11.15:11:08.THU   [SPOOLER REV 19.4.8]           aa
STARTED:  86-09-11.15:13:32.THU   ON: PRO      BY: PR750         aa

C
C  *********************LIST OF VARIABLES************************
C
C
C
C
C    A--(INTEGER)--ATTACK COUNTER
C    AA--(INTEGER)--ANOTHER ATTACK COUNTER
C    ABAINPUT--(CHARACTER*9)--AIRBASE ATTACK INPUT FILENAME
C    AD--(REAL(5,200))--NUMBER OF AIRCRAFT (MAINTENANCE TYPE, MISSION NUMBER)
C    ADS--SAME AS AD.  AD IS SET TO ZERO AFTER AIRCRAFT RETURN FROM
C         MAINTENANCE.  ADS IS USED AS PERMANENT STORAGE.
C    ANSWER--(CHARACTER*1)--ANSWER TO PROMPT, EITHER 'Y' OR 'N'
C    ANS1--(INTEGER)--ANSWER TO PROMPT, EITHER '1' OR '2'
C    ANS2--(CHARACTER*1)--ANSWER TO PROMPT, EITHER 'Y' OF 'N'
C    ATINPUT--(CHARACTER*12)--ATTRITION RATE INPUT FILENAME
C    ATT--(REAL)--CUMULATIVE AIR ATTRITION
C    ATTM--(REAL)--NUMBER OF AIRCRAFT ATTITTED DURING CURRENT MISSION
C    ATTRATE--(REAL(31))--ATTRITION RATE FOR EACH DAY (UP TO 30)
C    AVAIL--(REAL)--CURRENT AVAILABLE AIRCRAFT
C    AVAILA--(REAL(10,31))--AVAILABLE AIRCRAFT AT THE BEGINNING OF EACH DAY
C        (RUN NUMBER, DAY)
```

```
C   C--(INTEGER(10))--RUN NUMBERS OF DATA TO BE PLOTTED (NUMBER OF CURVES)
C   CATTA--(REAL(10, 31))--CUMULATIVE ATTRITION ARRAY (RUN NUMBER, DAY)
C   CAVAIL--(REAL)--NUMBER OF AIRCRAFT RETURNING FROM MAINTENANCE
C   CFUELC--(REAL(10,31))--CUMULATIVE FUEL CONSUMPTION ARRAY (RUN NUMBER,
C       DAY)
C   CMMH--(REAL(10,31))--CUMULATIVE MAINTENANCE MAN-HOURS ARRAY (RUN NUMBER,
C       DAY)
C   CPYLD--(REAL)--CURRENT PAYLOAD CAPABILITY
C   CPYLDA--(REAL(10,31))--CUMULATIVE PAYLOAD ARRAY (RUN NUMBER, DAY)
C   CSORTA--(REAL(10,31))-- CUMULATIVE SORTIES ARRAY (RUN NUMBER, DAY)
C   CSORTS--(REAL)--CUMULATIVE SORTIES COUNTER
C   CUMFUEL--(REAL)CUMULATIVE FUEL CONSUMPTION COUNTER
C   CUMGRAT--(REAL)--CUMULATIVE GROUND ATTRITION
C   CUMMH--(REAL(10,31))--CUMULATIVE MAINTENANCE MAN-HOURS (RUN NUMBER, DAY)
C   CUMPYLD--(REAL)--CUMULATIVE PAYLOAD COUNTER
C   DAM--(REAL)--NUMBER OF DAMAGED AIRCRAFT DURING CURRENT MISSION
C   DATT--(REAL)--DAILY ATTRITION, CURRENT DAY
C   DATTA--(REAL(10,31))--DAILY ATTRITION ARRAY (RUN NUMBER, DAY)
C   DAY--(INTEGER)--DAY COUNTER
C   DAYS--(INTEGER(10))--NUMBER OF DAYS IN RUN (RUN NUMBER)
C   DDAY--(INTEGER(7))--ATTACK DAYS, SET TO 1, 2, 3, 13, 14, AND 15
C   DFUELC--(REAL(10,31))--DAILY FUEL CONSUMPTION ARRAY (RUN NUMBER, DAY)
C   DMMH--(REAL(10,31))--DAILY MAINTENANCE MAN-HOUR ARRAY (RUN NUMBER, DAY)
C   DPYLD--(REAL)--DAILY PAYLOAD COUNTER
C   DPYLDA--(REAL(10,31))--DAILY PAYLOAD ARRAY (RUN NUMBER, DAY)
C   DSORTA--(REAL(10,31))--DAILY SORTIES ARRAY (RUN NUMBER, DAY)
C   DSORTS--(REAL)--DAILY SORTIES COUNTER
C   DUMMY--(CHARACTER*1)--ANSWER TO PROMPT, EITHER 'Y' OR 'NO'
C   EOD--(INTEGER)--END OF DAY FLAG
C   FCRATE--(INTEGER)--FUEL REQUIRED PER SORTIE (LBS OF FUEL)
C   FLTIME--(INTEGER)--FLIGHT TIME PER MISSION
C   FORCE--(INTEGER)--NUMBER OF AIRCRAFT IN INITIAL FORCE
C   FPYLD--(INTEGER)--MAX PAYLOAD (NO. OF WEAPONS) PER MISSION
C   GRAT--(REAL)--DAILY GROUND ATTRITION DUE TO ATTACK
C   GRATT--(REAL(7))--GROUND ATTRITION RATES FOR ATTACK DAYS 1-6
C   GROUPS--(INTEGER)--NUMBER OF GROUPS OF ACFT TO BE REARMED/REFUELED
C   GTIME--(INTEGER)--REARM/REFUEL TIME NEEDED BEFORE A MISSION
C   K--(INTEGER(10))--NUMBER OF POINTS IN PLOTTED CURVE (CURVE NUMBER)
C   LM--(INTEGER(5))--POINTER USED IN TD ARRAY (MAINTENANCE TYPE)
C   MAIN--(REAL)--NUMBER OF AIRCRAFT ENTERING MAINTENANCE AFTER CURRENT
C       MISSION
C   MAINRAT--(REAL)--MAINTENANCE RATE
C   MCAP--(REAL)--MISSION CAPABLE AIRCRAFT THAT FLEW THE PREVIOUS MISSION
C   MI--(INTEGER)--CURRENT MISSION NUMBER
C   MMHRATE--(REAL)--MAINTENANCE MAN-HOUR RATE
C   RUNWAY REOPENS AFTER AN ATTACK. USED FOR ADDING MAINTENANCE TIME.
C   MRWOPD--(INTEGER(3))--DAY THE MAIN RUNWAY OPENS AFTER EACH 3-DAY ATTACK
C       (ATTACK NUMBER)
C   MRWOPT--(INTEGER(3))--TIME OF DAY THE MAIN RUNWAY OPENS AFTER EACH 3-DAY
C       ATTACK (ATTACK NUMBER)
C   MSTART--(INTEGER)--NORMAL BEGINNING OF DAY TIME
C   MTBF--(REAL)--AIRCRAFT MEAN TIME BETWEEN FAILURE
C   NANSWER--(INTEGER)--TYPE OF CURVE TO BE PLOTTED
C   NOPRT--(INTEGER)--"NO PRINT" FLAG
C   OAVAIL--(REAL)--NUMBER OF AVAILABLE AIRCRAFT AT START OF MISSION
C   RM--(REAL)--REDUCED MAINTENANCE FACTOR
C   RMA--(REAL(3))--REDUCED MAINTENANCE FACTOR ARRAY FOR BOTH ATTACKS
C   RPYLDA--(REAL(7))--REDUCED PAYLOAD CAPABILITY ON ATTACK DAYS (ATTACK
C       DAY 1-6)
C   RR--(REAL)--REDUCED REARM/REFUEL FACTOR
C   RRA--(REAL)--REDUCED REARM/REFUEL ARRAY FOR BOTH ATTACKS
C   RRC--(INTEGER)--REDUCED REARM/REFUEL COUNTER
C   RUN--(INTEGER)--PROGRAM RUN COUNTER
C   RWOPT--INTEGER(7))--TEMP RUNWAY OPEN TIME ON ATTACK DAYS (ATTACK DAY 1-6)
C       NOTE: AIR BASE CLOSE TIME IS 0530
C   STIME--(INTEGER)--MISSION START TIME IN MILITARY FORMAT
C   SURV--(REAL)--
C   TD--(REAL(5,200))--THE TIME AIRCRAFT (MAINTENANCE TYPE, MISSION NUMBER)
C       RETURN FROM MAINTENANCE
```

```
C     TIME--(INTEGER)--CURRENT TIME IN MINUTES FROM 0000 ON DAY 1
C     TOTATT--(REAL)--SUM OF CUMULATIVE GROUND AND AIR ATTRITION
C     X--(REAL(10,31))--X-DATA TO BE PLOTTED (RUN NUMBER, DAY)
C     Y--(REAL(10,31))--Y-DATA TO BE PLOTTED (RUN NUMBER, DAY)
C
C
      DIMENSION TD(5,300),AD(5,300),LM(5),ADS(5,300),ATTRATE(31)
      DIMENSION X(10,31),Y(10,31),K(10),DSORTA(10,31),CSORTA(10,31)
     1,DATTA(10,31),CATTA(10,31),AVAILA(10,31)
      DIMENSION RPYLD(7),DPYLDA(10,31),CPYLDA(10,31),MRWOPT(3)
      DIMENSION MRWOPD(3),GRATT(7),RMA(3),RRA(5)
      DIMENSION DFUELC(10,31),CFUELC(10,31),DMMH(10,31),CMMH(10,31)
      DIMENSION WABAA(10),WABAI(10),WATI(10),WFORCE(10),WFLTIME(10)
      DIMENSION WMTBF(10),WFCRATE(10),WMMHRATE(10),WFPYLD(10)
      INTEGER DAY,STIME,TIME,GTIME,DAYPLS1,ANS1,RUN,C(10)
      INTEGER RWOPT(7),DDAY(7),FLTIME,DAYS(10),A,AA,HRS,GROUPS,RRC
      INTEGER FORCE,FPYLD,FCRATE,ATTACK,EOD
      INTEGER WFORCE,WFLTIME,WFCRATE,WFPYLD
      REAL MAIN, MCAP, MAINRAT,MMHRATE,MTBF
      CHARACTER*1 ANSWER,ANS2,DUMMY,WABAA
      CHARACTER*9 ABAINPUT,WABAI
      CHARACTER*12 ATINPUT,WATI
C  OPEN THE PRINT FILE.  THIS FILE WILL COLLECT ALL NON-GRAPHICS
C     SCREEN OUTPUT AND USER INPUTS.
C
      OPEN (9,FILE = 'SG.PRINT')
C
C  INITIALIZE THE PROGRAM EXECUTION COUNTER
C
      RUN = 0
C
C  DEFINE DAYS WHEN BASE IS UNDER ATTACK.    MISSIONS MAY BE
C     SKIPPED ON THESE DAYS.
C
    4 DDAY(1) = 1
      DDAY(2) = 2
      DDAY(3) = 3
      DDAY(4) = 13
      DDAY(5) = 14
      DDAY(6) = 15
      RMA(1) = .75
      RMA(2) = .5
      RRA(1) = 2.
      RRA(2) = 1.25
      RRA(3) = 2.
      RRA(4) = 1.5
C
C  ASK USER IF THIS RUN WILL INCLUDE AIR BASE ATTACK
C
      WRITE (1,200)
      WRITE (1,200)
      WRITE (9,200)
      WRITE (9,200)
      WRITE (1,800)
  800 FORMAT (' AIR BASE ATTACK CASE (Y,N)    ')
      READ (1,810) DUMMY
  810 FORMAT (A1)
      WRITE (9,800)
      WRITE (9,811) DUMMY
  811 FORMAT (2X, A1)
      WABAA(RUN+1) = DUMMY
C
C  SET ALL ATTACK DAYS TO DAY 0 FOR NON AIR BASE ATTACK CASE
C     AND SET ATTACK COUNTER TO THREE
C
      IF (DUMMY .EQ. 'N') THEN
         DO 2 I = 1, 6
            DDAY(I) = 0
```

```
      2     CONTINUE
            A = 3
            RM = 1
            RR = 1
            WABAI(RUN+1) =
            GO TO 25
         END IF
C
C  FOR AIRBASE ATTACK CASE, ASK USER FOR AIRBASE ATTACK INPUT
C      FILENAME AND READ RUNWAY OPEN TIME AND REDUCED PAYLOAD
C      FOR MISSIONS COMPLETED DURING ATTACK DAYS
C
      IF (DUMMY .NE. 'Y') GO TO 4
      WRITE (1,780)
  780 FORMAT (' INPUT AIR BASE ATTACK FILENAME    ')
      READ (1,790) ABAINPUT
  790 FORMAT (A9)
      WRITE (9,780)
      WRITE (9,791) ABAINPUT
  791 FORMAT (2X, A9)
      WABAI(RUN+1) = ABAINPUT
      OPEN (8, FILE = ABAINPUT)
      DO 3 I = 1, 6
           READ (8,*) RWOPT(I),RPYLD(I)
    3 CONTINUE
C
C  INITIALIZE THE ATTACK COUNTER
C
      A = 1
      RM = RMA(1)
      RRC = 1
      RR = RRA(1)
C
C  READ THE DAY AND TIME WHEN THE MAIN RUNWAY OPENS AFTER EACH
C     3-DAY ATTACK, THEN CONVERT THESE TIMES TO MINUTES FROM
C     DAY 1 TIME 0000
C
      DO 33 I = 1, 2
           READ (8,*) MRWOPD(I),MRWOPT(I)
           HRS = MRWOPT(I) / 100.
           MINS = MRWOPT(I) - HRS * 100.
           MRWOPT(I) = (MRWOPD(I) - 1) * 1440. + HRS * 60. + MINS
   33 CONTINUE
      CLOSE (8)
C
C  INCREMENT PROGRAM EXECUTION COUNTER
C
   25 RUN = RUN + 1
C
C  ASK USER FOR SOURCE OF INPUT DATA (INTERACTIVE OR INPUT FILENAME
C     SG.INPUT)
C
    8 WRITE (1,750)
  750 FORMAT (' INPUT 1 FOR INTERACTIVE INPUT',/,
     1' INPUT 2 FOR FILE INPUT',/,
     2' INPUT 3 FOR MODIFICATION OF PREVIOUS RUN')
      READ (1,*) ANS1
      WRITE (5,750)
      WRITE (9,*) ANS1
      IF (ANS1 .EQ. 1) GO TO 6
      IF (ANS1 .EQ. 3) THEN
           DAYS(RUN) = DAYS(RUN-1)
           GO TO 7
      END IF
C
C  READ INPUT FILE SG.INPUT
C
      IF (ANS1 .EQ. 2) THEN
           OPEN (5,FILE = 'SG.INPUT')
           READ (5,*) FORCE,DAYS(RUN),FLTIME,MTBF,
```

```
     1     FCRATE,MMHRATE,FPYLD
           CLOSE (5)
           GO TO 7
       END IF
C
       GO TO 8
C
C
C  RECEIVE INPUT INTERACTIVELY
C
     6 WRITE (1,900)
       WRITE (9,900)
       WRITE (1,700)
   700 FORMAT (' ** INPUT NUMBER OF AIRCRAFT IN INITIAL FORCE **')
       READ (1,*) FORCE
       WRITE (9,700)
       WRITE (9,*) FORCE
       WRITE (1,710)
   710 FORMAT (' ** INPUT ENGAGEMENT LENGTH IN DAYS **')
       READ (1,*) DAYS(RUN)
       WRITE (9,710)
       WRITE (9,*) DAYS(RUN)
       WRITE(1,840)
   840 FORMAT (' ** INPUT MISSION FLIGHT TIME IN MINUTES **')
       READ (1,*) FLTIME
       WRITE (9,840)
       WRITE (9,*) FLTIME
       WRITE (1,740)
   740 FORMAT (' ** INPUT AIRCRAFT MTBF IN HOURS **')
       READ (1,*) MTBF
       WRITE (9,740)
       WRITE (9,*) MTBF
       WRITE (1,820)
   820 FORMAT (' ** INPUT FUEL REQUIRED (LBS FUEL/SORTIE) **')
       READ (1,*) FCRATE
       WRITE (9,820)
       WRITE (9,*) FCRATE
       WRITE (1,830)
   830 FORMAT (' ** INPUT MAINTENANCE MAN-HOUR RATE (MMH/FH) **')
       READ (1,*) MMHRATE
       WRITE (9,830)
       WRITE (9,*) MMHRATE
       WRITE (1,850)
   850 FORMAT (' ** INPUT MAX PAYLOAD (NO. OF WEAPONS) **')
       READ (1,*) FPYLD
       WRITE (9,850)
       WRITE (9,*) FPYLD
C
C  ECHO THE INPUT DATA
C
     7 WRITE (1,910) FORCE,DAYS(RUN),FLTIME,MTBF,FCRATE,
      1MMHRATE,FPYLD
       WRITE (9,910) FORCE,DAYS(RUN),FLTIME,MTBF,FCRATE,
      1MMHRATE,FPYLD
   910 FORMAT (' ENTER NUMBER AND NEW VALUE OF VARIABLE TO BE CHANGED',
      1 /,6X,'(EX:  1,72)',//,
      1 ' 1 - NUMBER OF AIRCRAFT IN INITIAL FORCE =',I4,/,
      2 ' 2 - ENGAGEMENT LENGTH IN DAYS = ',I2,/,
      3 ' 3 - MISSION FLIGHT TIME IN MINUTES = ',I4,/,
      4 ' 4 - AIRCRAFT MTBF IN HOURS = ',F6.3,/,
      5 ' 5 - FUEL CONSUMPTION RATE (LBS FUEL/SORTIE) = ',I6,/,
      6 ' 6 - MAINTENANCE MAN-HOUR RATE (MMH/FH) = ',F4.1,/,
      7 ' 7 - MAX PAYLOAD PER MISSION (NO. OF WEAPONS) = ',I3,/,
      1 ' 0 - (ANY NUMBER) DATA IS CORRECT',//)
C
       READ (1,*) NVC, VNV
       WRITE (9,920) NVC, VNV
   920 FORMAT (2X, I2, 2X, F9.3)
C
C
```

```
      IF (NVC .EQ. 0) GO TO 41
      IF (NVC .EQ. 1) FORCE = VNV
      IF (NVC .EQ. 2) DAYS(RUN) = VNV
      IF (NVC .EQ. 3) FLTIME = VNV
      IF (NVC .EQ. 4) MTBF = VNV
      IF (NVC .EQ. 5) FCRATE = VNV
      IF (NVC .EQ. 6) MMHRATE = VNV
      IF (NVC .EQ. 7) FPYLD = VNV
      GO TO 7
C
C
C
   41 WFORCE(RUN) = FORCE
      WFLTIME(RUN) = FLTIME
      WMTBF(RUN) = MTBF
      WFCRATE(RUN) = FCRATE
      WMMHRATE(RUN) = MMHRATE
      WFPYLD(RUN) = FPYLD
C
C  READ ATTRITION RATES FOR EVERY DAY (UP TO 30)
C
      WRITE (1,770)
  770 FORMAT (' INPUT ATTRITION RATE FILENAME')
      READ (1,760) ATINPUT
  760 FORMAT (A12)
      WATI(RUN) = ATINPUT
      WRITE (9,770)
      WRITE (9,761) ATINPUT
  761 FORMAT (2X, A12)
      OPEN (7, FILE = ATINPUT)
      DO 9 I = 1, 30, 5
         READ (7,*) (ATTRATE(J), J = I, I+4)
    9 CONTINUE
      CLOSE (7)
C
C  INITIALIZE VARIABLES (CUMULATIVE ATTRITION, DAILY ATTRITION, MISSIONS
C     SKIPPED DUE TO AN ATTACK AND NO PRINT FLAGS, DAY COUNTER, DAILY
C     SORTIES, CUMULATIVE SORTIES, FUEL CONSUMED AND MAINTENANCE MAN-
C     HOURS PER FLIGHT-HOUR, CURRENT PAYLOAD CAPACITY, CUMULATIVE
C     PAYLOAD, DAILY PAYLOAD, AVAILABLE AIRCRAFT, AND GROUND ATTRITION
C     RATES)
      ATT = 0.
      DATT = 0.
      MCLOSE = 0
      NOPRT = 0
      EOJ = 0
      DAY = 0.
      DSORTS = 0.
      CSORTS = 0.
      CUMFUEL = 0.
      CUMMMH = 0.
      DAYPLS1 = 1
      CPYLD = FPYLD
      CUMPYLD = 0.
      DPYLD = 0.
      AVAIL = FORCE
      AVAILA(RUN,1) = AVAIL
      GRATT(1) = .05
      GRATT(2) = .015
      GRATT(3) = .005
      GRATT(4) = .015
      GRATT(5) = .0075
      GRATT(6) = .0025
      GRAT = 0.
      CUMGRAT = 0.
      TOTATT = 0.
      AA = 1.
C
C  CALCULATE THE MAINTENANCE RATE BASED ON ACFT MTBF
C
```

```
C  IF AIRCRAFT MTBF IS LESS THAN MISSION LENGTH, AIRCRAFT WILL BE
C     GAINED DURING THE MAINTENANCE CYCLE. TO ELIMINATE THIS
C     PROBLEM, IF INPUTTED MTBF IS LESS THAN THE MISSION LENGTH,
C     THE PROGRAM WILL SET MTBF EQUAL TO MISSION LENGTH.
C
      MAINRAT = FLTIME / (MTBF * 60)
      IF (MAINRAT .GT. 1.0) THEN
         WRITE (1,930)
  930    FORMAT (' ** ERROR -- MTBF IS LESS THAN MISSION LENGTH',/,
     1   ' MTBF MUST BE GREATER THAN OR EQUAL TO MISSION LENGTH',//)
         WRITE (9,930)
         GO TO 7
      END IF
C
C
C  INITIALIZE MAINTENANCE AND DAMAGE POINTER
C
      DO 5 I = 1, 5
         LM(I) = 1.
    5 CONTINUE
C
C  DEFINE NORMAL DAY START TIME
C
      MSTART = 360
C
C  START TIMER
C
      TIME = MSTART
C
C
C  WRITE OUTPUT HEADING FOR DAY 1
C
      WRITE (1,900)
      WRITE (1,200)
      WRITE (1,300) DAYPLS1
      WRITE (1,200)
      WRITE (1,310)
      WRITE (1,320)
  320 FORMAT (' ')
      WRITE (9,900)
      WRITE (9,200)
      WRITE (9,301) DAYPLS1
      WRITE (9,200)
      WRITE (9,311)
      WRITE (9,320)
C
C  BEGIN MAIN LOOP TO BE EXECUTED FOR EVERY MISSION
C
      DO 10 MI = 1, 350
         IF (AVAIL .LT. 0.0) AVAIL = 0.0
C
C  IF BASE HAS BEEN ATTACKED AND MAIN RUNWAY IS READY TO REOPEN, SET
C     PAYLOAD TO FULL CAPACITY, INCREMENT ATTACK COUNTER AND TELL
C     USER MAIN RUNWAY IS NOW OPEN BEFORE EXECUTING NEXT MISSION
C
            IF (A .LE. 2) THEN
               IF (TIME .GE. MRWOPT(A)) THEN
                  CPYLD = FPYLD
                  RM = RMA(A)
                  RRC = RRC + 1
                  RR = RRA(RRC)
                  STIME = MRWOPT(A) - DAY * 1440
                  IHRS = STIME / 60
                  PTIME = STIME
                  RHRS = PTIME / 60.
                  RMINS = RHRS - IHRS
                  IMINS = 60. * RMINS
                  STIME = 100 * IHRS + IMINS
                  A = A + 1
                  WRITE (1,670) STIME
```

```
670              FORMAT (I4,23X,' MAIN RUNWAY REOPENS ')
                 WRITE (9,671) STIME
671              FORMAT (12X,I4,23X,' MAIN RUNWAY REOPENS ')
          END IF
       END IF
C
C  SET THE NEXT ENGAGEMENT DAY AND SAVE THE NUMBER OF AVAILABLE
C      AIRCRAFT AT THE BEGINNING OF THE MISSION
C
       DAYPLS1 = DAY + 1
C
C  IF BASE IS UNDER ATTACK THIS DAY AND MISSIONS HAVE NOT ALREADY BEEN
C      SKIPPED (MCLOSE .EQ. 1), THEN REDUCE THE PAYLOAD CAPACITY,
C      CALCULATE THE GROUND ATTRITION AND UPDATE THE AVAILABLE ACFT, CALL
C      THE MISSION SKIP SUBROUTINE, DEFINE THE NUMBER OF MISSION CAPABLE
C      AIRCRAFT, SET THE MISSION SKIP FLAG (SO SAME MISSIONS ARE NOT
C      SKIPPEDAGAIN NEXT TIME THROUGH THE LOOP) , AND CHANGE THE MISSION
C      NUMBER AND NO PRINT OPTION IF ALL MISSIONS ARE SKIPPED THIS DAY
C
       DO 31 I = 1, 6
           IF (DAYPLS1 .EQ. DDAY(I)) THEN
               IF (MCLOSE .EQ. 1) GO TO 31
               CPYLD = RPYLD(I)
               GRAT = GRATT(I) * (FORCE - TOTATT)
               AVAIL = AVAIL - GRAT
               CALL CLOSED(RWOPT(I),TIME)
               MCAP = OAVAIL
               MCLOSE = 1
               IF (TIME .GT. (DAY*1440.+1200.)) THEN
                   NOPRT = 1
                   MI = MI - 1
                   EOD = 1
                   GO TO 32
               END IF
           END IF
31     CONTINUE
C
C CALCULATE GROUND TIME FOR REARMING AND REFUELING
C
       REFUELF = FCRATE / (6.54 * 600.)
       REARMF = 10.
       GROUPS = AVAIL / 6
       GROUPS = GROUPS + 1
       IF (REFUELF .GE. REARMF) THEN
           GTIME = RR * (GROUPS * REFUELF + 3.)
       ELSE
           GTIME = RR * (GROUPS * REARMF + 3.)
       END IF
       TIME = TIME + GTIME
       IF (TIME .GT. (DAY*1440.+1200.)) THEN
           NOPRT = 1
           MI = MI - 1
           EOD = 1
           GO TO 32
       END IF
C
C  RUN A MISSION.  CALCULATE ATTRITTED ACFT AND THE NUMBER OF SORTIES;
C      INCREMENT DAILY SORTIES, PAYLOAD, AND ATTRITION; REDUCE THE
C      AVAILABLE ACFT BY THE NUMBER OF ATTRITTED ACFT; CALCULATE
C      DAMAGED ACFT, SURVIVING ACFT, ACFT REQUIRING MAINTENANCE, AND
C      MISSION CAPABLE ACFT.  DETERMINE TIME WHEN DAMAGED ACFT AND
C      ACFT REQUIRING MAINTENANCE AFTER THE NEXT MISSION WILL BE
C      AVAILABLE.  REDUCE THE NUMBER OF AVAILABLE AIRCRAFT BY THE
C      NUMBER OF DAMAGED ACFT AND ACFT REQUIRING MAINTENANCE.
C
       OAVAIL = AVAIL
       TIME = TIME + FLTIME
       ATTM = ATTRATE(DAYPLS1) * AVAIL
       DATT = DATT + ATTM
```

```
            DSORTS = DSORTS + DAVAIL
            DPYLD = DPYLD + OAVAIL * CPYLD
            ATT = ATTRATE(DAYPLS1) * AVAIL + ATT
            AVAIL = OAVAIL - ATTM
            DAM = 3.0 * ATTRATE(DAYPLS1) * OAVAIL
            TD(1,MI) = (1/RM) * 1440. + TIME
            AD(1,MI) = DAM
            SURV = OAVAIL - DAM - ATTM
            MAIN = MAINRAT * SURV
            MCAP = SURV - MAIN
C           TD(2,MI) = (1/RM) * 120. + TIME
            TD(3,MI) = (1/RM) * 480. + TIME
            TD(4,MI) = (1/RM) * 1440. + TIME
            TD(5,MI) = (1/RM) * 14400. + TIME
      IF (AA .EQ. A) THEN
            TD(1,MI) = (1/RM) * 1440. + MRWOPT(A)
            TD(2,MI) = (1/RM) * 120. + MRWOPT(A)
            TD(3,MI) = (1/RM) * 480. + MRWOPT(A)
            TD(4,MI) = (1/RM) * 1440. + MRWOPT(A)
            TD(5,MI) = (1/RM) * 14400. + MRWOPT(A)
      END IF
C
            AD(2,MI) = .39 * MAIN
            AD(3,MI) = .39 * MAIN
            AD(4,MI) = .19 * MAIN
            AD(5,MI) = .03 * MAIN
C
            DO 40 I = 1, 5
                AVAIL = AVAIL - AD(I,MI)
   40       CONTINUE
C
C  TEST THE POOL OF AIRCRAFT IN MAINTENANCE AND DAMAGED ACFT TO DETERMINE
C       WHICH ACFT WILL BE AVAILABLE FOR THE NEXT MISSION. INCREASE THE NUMBER
C       OF AVAILABLE ACFT AND RESET THE POINTER
C
            DO 20 J = 1, 5
C
                DO 30 I = LM(J), MI
                    ADS(J,I) = AD(J,I)
C
                    IF (TD(J,I).LE.TIME) THEN
                        AVAIL = AVAIL + AD(J,I)
                        AD(J,I) = 0.
                        LM(J) = I
                    END IF
C
   30           CONTINUE
C
   20       CONTINUE
C
C  CALCULATE NUMBER OF ACFT RETURNING FROM MAINTENANCE
C
            CAVAIL = AVAIL - MCAP
            IF (CAVAIL .LT. 0.) CAVAIL = 0.
C
C  CALCULATE MISSION START TIME AND CONVERT TO MILITARY TIME
C
            STIME = TIME - FLTIME - DAY * 1440
            IHRS = STIME / 60
            PTIME = STIME
            RHRS = PTIME / 60.
            RMINS = RHRS - IHRS
            IMINS = 60. * RMINS
            STIME = 100 * IHRS + IMINS
C
C  AT THE END OF A DAY, INCREMENT THE DAY COUNTER, RESET THE
C       MISSION SKIP FLAG TO ZERO AND CALCULATE THE TIME THE
C       NEXT MISSION WILL START. TEST THE POOL OF ACFT IN
```

```
C      MAINTENANCE AND DAMAGED ACFT TO DETERMINE WHICH ACFT WILL
C      BECOME AVAILABLE OVERNIGHT.  INCREASE THE NUMBER OF
C      AVAILABLE ACFT AND RESET THE POINTER
C
    32 IF (EOD .EQ. 1) THEN
             DAY = DAY + 1
             MCLOSE = 0
             TIME = 1440. * DAY + MSTART
             IF (DAY .EQ. (DDAY(4) - 1)) TIME = TIME - 30
C
             COAVAIL = AVAIL
             DO 60 J = 1, 5
C
                DO 70 I = LM(J), MI
                    ADS(J,I) = AD(J,I)
C
                    IF (TD(J,I) .LE. TIME) THEN
                        AVAIL = AVAIL + AD(J,I).
                        LM(J) = I
                        AD(J,I) = 0.
                    END IF
C
    70          CONTINUE
C
    60       CONTINUE
             CAVAIL = AVAIL - COAVAIL
             IF (CAVAIL .LT. 0.) CAVAIL = 0.
             WRITE(1,940) CAVAIL
             WRITE(9,941) CAVAIL
   940       FORMAT (59X, F5.2)
   941       FORMAT (71X, F5.2)
             IF (DAY .EQ. (DDAY(4) - 1)) THEN
                 AA = AA + 1
                 RM = RMA(2)
                 RRC = RRC + 1
                 RR = RRA(RRC)
                 DO 61 J = 1, 5
                 DO 71 I = LM(J), MI
                     TD(J,I) = TD(J,I) + MRWOPT(A) - TIME
    71           CONTINUE
    61           CONTINUE
                 TIME = TIME + 30
             END IF
C
         END IF
C
C  UNLESS THE NO PRINT FLAG IS ON, OUTPUT ALL DATA GENERATED BY
C      THE MOST RECENT MISSION
C
         IF(NOPRT.NE.1) THEN
             WRITE (1,100) STIME, OAVAIL, ATTM, DAM, MAIN,
     1       ADS(2,MI), ADS(3,MI), ADS(4,MI), ADS(5,MI), CAVAIL, MCAP
   100       FORMAT (I4,1X,F6.2,3X,F4.2,2X,F5.2,2X,F5.2,
     1       2X,F5.2,1X,F5.2,2X,F4.2,2X,F4.2,2X,F5.2,2X,F5.2)
             WRITE (9,101) STIME,OAVAIL,ATTM,DAM,MAIN,
     1       ADS(2,MI),ADS(3,MI),ADS(4,MI),ADS(5,MI),CAVAIL,MCAP
   101       FORMAT (12X,I4,1X,F6.2,3X,F4.2,2X,F5.2,2X,F5.2,
     1       2X,F5.2,1X,F5.2,2X,F4.2,2X,F4.2,2X,F5.2,2X,F5.2)
         END IF
C
C  RESET THE NO PRINT FLAG
C
         NOPRT = 0
C
C  AFTER THE LAST MISSION OF THE DAY, OUTPUT THE DAILY AND
C      CUMULATIVE ATTRITION; INCREMENT THE CUMULATIVE SORTIES
C      AND PAYLOAD; OUTPUT THE DAILY AND CUMULATIVE SORTIES;
C      OUTPUT THE DAILY AND CUMULATIVE PAYLOAD; SAVE THE VALUES
C      FOR DAILY AND CUMULATIVE SORTIES, DAILY AND CUMULATIVE
```

```
C       PAYLOAD, DAILY AND CUMULATIVE ATTRITION, AND AVAILABLE
C       ACFT FOR THE BEGINNING OF THE NEXT DAY.  CALCULATE AND
C       SAVE THE DAILY AND CUMULATIVE FUEL CONSUMPTION, AND
C       DAILY AND CUMULATIVE MAINTENANCE MAN-HOURS.  RESET THE
C       DAILY COUNTERS FOR ATTRITION, SORTIES, PAYLOAD, AND GROUND
C       ATTRITION TO ZERO.
C
              IF (EOD .EQ. 1) THEN
                 WRITE (1,200)
                 WRITE (9,200)
                 DAYPLS1 = DAY + 1
                 CUMGRAT = CUMGRAT + GRAT
                 TOTATT = ATT + CUMGRAT
                 WRITE (1,400) DAY,DATT,ATT,GRAT,CUMGRAT,TOTATT
400              FORMAT ('DAY',I3,' OPS SUMMARY',//,
     1           'DAILY COMBAT ATTRITION =',F6.2,' ACFT',2X,
     2           'CUM COMBAT ATTRITION =',F7.2,' ACFT',//,
     3           'DAILY GROUND ATTRITION =',F6.2,' ACFT',2X,
     4           'CUM GROUND ATTRITION =',F7.2,' ACFT',//,44X,
     5           'CUM ATTRITION =',F7.2,' ACFT')
                 WRITE (9,401) DAY,DATT,ATT,GRAT,CUMGRAT,TOTATT
401              FORMAT (12X,'DAY',I3,' OPS SUMMARY',//,
     1           12X,'DAILY COMBAT ATTRITION =',F6.2,' ACFT',2X,
     2           'CUM COMBAT ATTRITION =',F7.2,' ACFT',//,12X,
     3           'DAILY GROUND ATTRITION =',F6.2,' ACFT',2X,
     4           'CUM GROUND ATTRITION =',F7.2,' ACFT',//,56X,
     5           'CUM ATTRITION =',F7.2,' ACFT')
                 ATTPCT = TOTATT * 100. / FORCE
                 CSORTS = CSORTS + DSORTS
                 CUMPYLD = CUMPYLD + DPYLD
                 WRITE (1,320)
                 WRITE (9,320)
                 WRITE (1,600) ATTPCT
600              FORMAT (40X,'PERCENT ATTRITION =',F7.2,' %')
                 WRITE (1,320)
                 WRITE (1,610) DSORTS, CSORTS
610              FORMAT (9X,'DAILY SORTIES =',F7.2,
     1           8X,'CUMULATIVE SORTIES = ',F8.2)
                 WRITE (1,320)
                 WRITE (9,601) ATTPCT
601              FORMAT (52X,'PERCENT ATTRITION =',F7.2,' %')
                 WRITE (9,320)
                 WRITE (9,611) DSORTS,CSORTS
611              FORMAT (21X,'DAILY SORTIES =',F7.2,
     1           8X,'CUMULATIVE SORTIES = ',F8.2)
                 WRITE (9,320)
                 WRITE (1,660) DPYLD,CUMPYLD
660              FORMAT (9X,'DAILY PAYLOAD =',F6.0,
     1           9X,'CUMULATIVE PAYLOAD = ',F8.0)
                 WRITE (9,661) DPYLD,CUMPYLD
661              FORMAT (21X,'DAILY PAYLOAD =',F6.0,
     1           9X,'CUMULATIVE PAYLOAD = ',F8.0)
C
                 DSORTA(RUN,DAY) = DSORTS
                 CSORTA(RUN,DAY) = CSORTS
                 DPYLDA(RUN,DAY) = DPYLD
                 CPYLDA(RUN,DAY) = CUMPYLD
                 AVAILA(RUN,DAYPLS1) = AVAIL
                 DATTA(RUN,DAY) = DATT + GRAT
                 CATTA(RUN,DAY) = TOTATT
                 DFUELC(RUN,DAY) = DSORTS * FCRATE / 1000.
                 CUMFUEL = CUMFUEL + DFUELC(RUN,DAY)
                 CFUELC(RUN,DAY) = CUMFUEL
                 DMMH(RUN,DAY) = FLTIME * DSORTS * MMHRATE / 60.
                 CUMMMH = CUMMMH + DMMH(RUN,DAY)
                 CMMH(RUN,DAY) = CUMMMH
                 DATT = 0.
                 DSORTS = 0.
                 DPYLD = 0.
                 GRAT = 0.
```

```
C  AFTER EVERY 2 DAYS, SKIP TO THE TOP OF THE NEXT PAGE (FOR THE LINE
C      PRINTER)
C
               IF (MOD(DAY,2) .EQ. 0) WRITE (1,900)
   900         FORMAT ('1')
               WRITE (1,200)
               WRITE (1,200)
C
               IF(MOD(DAY,2) .EQ. 0) WRITE (9,900)
               WRITE (9,200)
               WRITE (9,200)
C
C  UNLESS RUN IS COMPLETE (LAST DAY), WRITE HEADING FOR NEXT DAY
C
               IF (DAY .NE. DAYS(RUN)) THEN
                  WRITE (1,300) DAYPLS1
   300            FORMAT ('******* DAY',I3,' *****************************
      1****************************')
                  WRITE (1,200)
                  WRITE (1,310)
   310            FORMAT ('MSSN',2X,'AVAIL',3X,'ATTR',3X,'DAMG',2X,
      1           'MAINT',3X,'2 HR',2X,'8 HR',2X,'24HR',2X,'10DA',3X,
      1           'RETN',3X,'MSSN',/,
C
      1           'TIME',3X,'ACFT',3X,'ACFT',3X,'ACFT',
      1           3X,'ACFT',3X,'REPR',2X,'REPR',2X,'REPR',2X,'REPR',3X,
      1           'ACFT',3X,'CPBL',/,
C
      1           '----',2X,'-----',3X,'----',
      1           3X,'----',2X,'-----',3X,'----',2X,'----',2X,'----',
      1           2X,'----',3X,'----',3X,'----')
C
                  WRITE (1,320)
   200            FORMAT (/)
                  WRITE (9,301) DAYPLS1
   301            FORMAT (12X,'******* DAY',I3,' *************************
      1****************************')
                  WRITE (9,200)
                  WRITE (9,311)
   311            FORMAT (12X,'MSSN',2X,'AVAIL',3X,'ATTR',3X,'DAMG',2X,
      1           'MAINT',3X,'2 HR',2X,'8 HR',2X,'24HR',2X,'10DA',3X,
      1           'RETN',3X,'MSSN',/,
C
      1           12X,'TIME',3X,'ACFT',3X,'ACFT',3X,'ACFT',
      1           3X,'ACFT',3X,'REPR',2X,'REPR',2X,'REPR',2X,'REPR',3X,
      1           'ACFT',3X,'CPBL',/,
C
      1           12X,'----',2X,'-----',3X,'----',
      1           3X,'----',2X,'-----',3X,'----',2X,'----',2X,'----',
      1           2X,'----',3X,'----',3X,'----')
                  WRITE (9,320)
               ELSE
                  GO TO 59
               END IF
C
            END IF
C
C  RESET END OF DAY FLAG AND RETURN FOR NEXT MISSION
C
         EOD = 0
   10 CONTINUE
C
C  AFTER RUN IS COMPLETE, ENTER PLOTTING OPTION
C
C  USING PLOT10 ROUTINES, GIVE USER OPTION OF PLOTTING DATA FROM ANY
C     OR ALL OF PREVIOUS RUNS
C
   59 CALL GRSTRT(4014,1)
      CALL BAUDRT (9600)
   11 CALL GETUTX (1,' ',1,DUMMY,IGOTD)
      CALL NEWPAG
```

```
      CALL GETUTX (33,'DO YOU WISH TO PLOT RESULTS (Y,N)',1,ANSWER,IGOT)
      CALL NEWPAG
C
C  IF USER DOES NOT WANT TO PLOT AT THIS TIME, GIVE USER OPTION OF RUNNING
C     NEW CASE OR QUITTING
C
   12 IF (ANSWER .EQ. 'N') THEN
          CALL GETUTX (17,' RESTART (Y,N)     ',1,ANS2,IGOTA)
          CALL NEWPAG
          CALL GRSTOP
          IF (ANS2 .EQ. 'Y') GO TO 4
          GO TO 51
      END IF
C
      IF (ANSWER .NE. 'Y') GO TO 11
      CALL GRSTOP
C
C  ASK USER FOR TYPE OF CURVE TO BE PLOTTED OR TO QUIT PLOTTING
C
   14 WRITE (1,620)
  620 FORMAT('1 - DAILY SORTIES',/,'2 - CUMULATIVE SORTIES',/,
     1'3 - AVAILABLE AIRCRAFT',/,'4 - DAILY ATTRITION',/,
     2'5 - CUMULATIVE ATTRITION',/,'6 - DAILY FUEL CONSUMPTION ',
     2'(1000 LBS)',/,
     3'7 - CUMULATIVE FUEL CONSUMPTION (1000 LBS)',/,
     3'8 - DAILY MAINTENANCE ',
     4'MAN-HR',/,'9 - CUMULATIVE MAINTENANCE MAN-HR',/,
     5'10- DAILY PAYLOAD',/,'11- CUMULATIVE PAYLOAD',/,'0 - QUIT',//,
     6'INPUT NO. OF CURVE TYPE',/)
C
      READ (1,*) NANSWER
C
C  IF USER CHOOSES TO QUIT, GIVE USER OPTION OF RUNNING A NEW CASE
C
      IF (NANSWER .EQ. 0) THEN
          WRITE (1,640)
  640     FORMAT ('RESTART (Y/N)     ')
          READ (1,650) ANS2
  650     FORMAT (A1)
          IF (ANS2 .EQ. 'Y') GO TO 4
          GO TO 51
      END IF
C
C  IF USER CHOOSES TO PLOT, ASK THE USER FOR CASE NUMBERS TO BE PLOTTED
C
      CALL GRSTRT(4014,1)
      CALL BAUDRT (9600)
      CALL NEWPAG
      CALL CMCLOS
      WRITE(1,950)
  950 FORMAT(/////,26X,'RUN SUMMARY MATRIX',//,1X,'RUN ABA ',
     1'ABA FILNM FORCE DAYS FL T MTBF FC RATE MMHR ',
     2'PYLD ATT FILENAME',/,1X,'--- --- ',
     3'--------- ----- ---- ---- ---- -------- ----',
     4' ---- ------------',/)
      DO 72 I = 1, RUN
      WRITE(1,960) I,WABAA(I),WABAI(I),WFORCE(I),DAYS(I),
     1WFLTIME(I),WMTBF(I),WFCRATE(I),WMMHRATE(I),WFPYLD(I),
     2WATI(I)
  960 FORMAT(1X,I2,3X,A1,2X,A9,2X,I3,3X,I2,2X,I3,2X,F4.2,
     11X,I6,2X,F4.1,2X,I2,2X,A12)
   72 CONTINUE
      CALL CMOPEN
      CALL GETUIN(32,' ENTER RUN NOS. TO BE PLOTTED    ',10,C,NCURVE)
      CALL NEWPAG
      CALL GRSTOP
C
C  DEFINE THE MINIMUM AND MAXIMUM VALUES FOR X-AXIS
C
```

```
      XMIN = 1
      XMAX = DAYS(1)
C
C DETERMINE THE MAXIMUM RANGE OF THE X-DATA TO BE PLOTTED
C
      DO 36 I = 1, RUN
          IF(DAYS(I) .GT. XMAX) XMAX = DAYS(I)
   36 CONTINUE
C
C DEFINE THE X-DATA

DO 23 J = 1, NCURVE
          DO 15 I = 1, DAYS(C(J))
              X(C(J),I) = I
   15     CONTINUE
C
C DEFINE THE NUMBER OF POINTS PER CURVE
C
          K(C(J)) = DAYS(C(J))
C
C DEFINE THE Y-DATA DEPENDING ON THE CURVE CHOSEN BY THE USER
C
          IF (NANSWER .EQ. 1) THEN
              DO 16 I = 1, K(C(J))
                  Y(C(J),I) = DSORTA(C(J),I)
   16         CONTINUE
          END IF
C
          IF (NANSWER .EQ. 2) THEN
              DO 17 I = 1, K(C(J))
                  Y(C(J),I) = CSORTA(C(J),I)
   17         CONTINUE
          END IF
C
          IF (NANSWER .EQ. 3) THEN
              DO 18 I = 1, K(C(J))
                  Y(C(J),I) = AVAILA(C(J),I)
   18         CONTINUE
          END IF
C
          IF (NANSWER .EQ. 4) THEN
              DO 19 I = 1, K(C(J))
                  Y(C(J),I) = DATTA(C(J),I)
   19         CONTINUE
          END IF
C
          IF (NANSWER .EQ. 5) THEN
              DO 21 I = 1, K(C(J))
                  Y(C(J),I) = CATTA(C(J),I)
   21         CONTINUE
          END IF
C
          IF(NANSWER .EQ. 6) THEN
              DO 26 I = 1, K(C(J))
                  Y(C(J),I) = DFUELC(C(J),I)
   26         CONTINUE
          END IF
C
          IF (NANSWER .EQ. 7) THEN
              DO 27 I = 1, K(C(J))
                  Y(C(J),I) = CFUELC(C(J),I)
   27         CONTINUE
          END IF
C
          IF (NANSWER .EQ. 8) THEN
              DO 28 I = 1, K(C(J))
                  Y(C(J),I) = DMMH(C(J),I)
   28         CONTINUE
```

```
      END IF
C
      IF (NANSWER .EQ. 9) THEN
          DO 29 I = 1, K(C(J))
              Y(C(J),I) = CMMH(C(J),I)
29        CONTINUE
      END IF
C
      IF (NANSWER .EQ. 10) THEN
          DO 34 I = 1, K(C(J))
              Y(C(J),I) = DPYLDA(C(J),I)
34        CONTINUE
      END IF
C
      IF (NANSWER .EQ. 11) THEN
          DO 35 I = 1, K(C(J))
              Y(C(J),I) = CPYLDA(C(J),I)
35        CONTINUE
      END IF
C
23 CONTINUE
C
C DETERMINE THE MINIMUM AND MAXIMUM VALUES OF THE Y-DATA
C
      YMIN = Y(C(1),1)
      YMAX = Y(C(1),1)
C
      DO 24 J = 1, NCURVE
          DO 22 I = 1, K(C(J))
              IF (Y(C(J),I) .GT. YMAX) YMAX = Y(C(J),I)
              IF (Y(C(J),I) .LT. YMIN) YMIN = Y(C(J),I)
22        CONTINUE
24    CONTINUE
C
C SHOW THE USER THE MIN AND MAX VALUES OF THE X- AND Y-DATA.  LET THE
C     USER CHOOSE THE RANGE AND DOMAIN FOR THE PLOT
C
      WRITE (1,630) XMIN, XMAX, YMIN, YMAX
630 FORMAT (' THE RANGE IS ',2F4.0,' THE DOMAIN IS ',2F8.0,/,
     1' INPUT XMIN, XMAX, YMIN, YMAX ',/)
      READ (1,*) XMIN, XMAX, YMIN, YMAX
C
C CALL THE PLOTTING ROUTINE
C
      CALL PLOT (NCURVE, XMIN, XMAX, YMIN, YMAX, X, Y, K, C)
C
C GIVE USER OPTION TO PLOT NEW CURVE TYPE OR TO QUIT PLOTTING
C
C
      GO TO 14
C
51 CLOSE (9)
      STOP
      END
C
C
      SUBROUTINE PLOT(NCURVE,XMIN,XMAX,YMIN,YMAX,X,Y,K,C)
      DIMENSION X(10,31),Y(10,31),K(10)
      INTEGER C(10)
      CHARACTER*1 DUMMY
      CHARACTER*40 XTITLE,YTITLE,TITLE,SUBTITLE
      CALL GRSTRT(4014,1)
      CALL BAUDRT (9600)
      CALL NEWPAG
      CALL GETUTX(12,' INPUT TITLE',40,TITLE,IGOTT)
      CALL GETUTX(15,' INPUT SUBTITLE',40,SUBTITLE,IGOTS)
      CALL GETUTX(19,' INPUT X-AXIS LABEL',40,XTITLE,IGOTX)
      CALL GETUTX(19,' INPUT Y-AXIS LABEL',40,YTITLE,IGOTY)
      CALL NEWPAG
```

```
      XINC=(XMAX-XMIN)/10.
      YINC=(YMAX-YMIN)/10.
      X2INC=XINC/10.
      CALL TXICUR(5)
      CALL TXFCUR(3)
      CALL MOVE(15.,15.)
      XX=XMIN
      CALL VECREL
      DO 61 I = 1, 11
          CALL MOVE(0.,-6.)
          CALL RNUMBR(XX,-1,2)
          CALL MOVE(0.,4.)
          CALL DRAW(0.,2.)
          IF (I .LT. 11) CALL DRAW(11.,0.)
          XX = XX + XINC
   61 CONTINUE
      CALL VECABS
      CALL MOVE(15.,15.)
      YY=YMIN
      CALL VECREL
      DO 71 I = 1, 11
          CALL MOVE(-7.,0.)
          CALL RNUMBR(YY,-1,5)
          CALL MOVE(5.,0.)
          CALL DRAW(2.,0.)
          IF (I.LT.11) CALL DRAW(0.,7.)
          YY = YY + YINC
   71 CONTINUE
      CALL VECABS
      CALL MOVE(15.,15.)
      CALL DASHPT(1)
      CALL VECREL
      DO 15 I = 1, 10
          CALL MOVE(0.,7.)
          CALL DRAW(110.,0.)
          CALL MOVE(-110.,0.)
   15 CONTINUE
      CALL VECABS
      CALL MOVE(15.,15.)
      CALL VECREL
      DO 25 I = 1, 10
          CALL MOVE(11.,0.)
          CALL DRAW(0.,70.)
          CALL MOVE(0.,-70.)
   25 CONTINUE
      CALL DASHPT(0)
      CALL VECABS
      CALL VWPORT(15.,125.,15.,85.)
      CALL WINDOW(XMIN,XMAX,YMIN,YMAX)
      DO 80 JJ = 1, NCURVE
          CALL SKIP
          CALL VECABS
          DO 90 KK = 1, K(C(JJ))
              CALL DRAW(X(C(JJ),KK),Y(C(JJ),KK))
              CALL MARKER(X(C(JJ),KK),Y(C(JJ),KK),0)
   90     CONTINUE
          CALL VECREL
          CALL MOVE(X2INC,0)
          CALL INUMBR(C(JJ),2)
          CALL VECABS
   80 CONTINUE
      CALL VECABS
      CALL VWPORT(0.,130.,0.,100.)
      CALL WINDOW(0.,130.,0.,100.)
      CALL MOVE(70.,3.)
      CALL TXICUR(5)
      CALL TEXT(IGOTX,XTITLE)
      CALL TXSIZE(0,1.3,0.)
      CALL MOVE(1.,50.)
```

```
       CALL TXANGL (90.)
       CALL TEXT(IGOTY,YTITLE)
       CALL MOVE(70.,95.)
       CALL TXSIZE(0,2.,0.)
       CALL TXANGL(0.)
       CALL TEXT(IGOTT,TITLE)
       CALL MOVE(70.,88.)
       CALL TEXT(IGOTS,SUBTITLE)
       CALL MOVE(0.,4.)
       CALL GETUTX(1,' ',1,DUMMY,IGOTD)
       CALL NEWPAG
       CALL GRSTOP
       RETURN
       END
C
C
       SUBROUTINE CLOSED(OPENT,TIME)
       INTEGER CLTIME,TIME,OPENT
C
C  OUTPUT BASE CLOSING AND OPENING TIMES
C
       WRITE (1,501)
  501  FORMAT ('0530',25X,' AIR BASE CLOSED ')
       WRITE (9,503)
  503  FORMAT (12X,'0530',25X,' AIR BASE CLOSED ')
       WRITE (1,502) OPENT
  502  FORMAT (I4,25X,' AIR BASE OPENED ')
       WRITE (9,504) OPENT
  504  FORMAT(12X,I4,25X,' AIR BASE OPENED ')
C
C  DETERMINE THE LENGTH OF TIME (IN MINUTES) THAT THE BASE IS CLOSED DUE
C      TO AN ATTACK ON THIS DAY
C
       NOPENT = OPENT
       NOHRS = NOPENT / 100
       NOMINS = NOPENT - NOHRS * 100
       CLTIME = (NOMINS-29) + (NOHRS-5) * 60
C
C
C  INCREMENT THE TIME
C
       TIME = TIME + CLTIME - 30
       RETURN
       END
```

What is claimed is:

1. A method of operation of an airbase sortie generation analysis computer program model for analyzing the sortie generation capabilities and support requirements of aircraft designs, comprising the steps:

reading data parameters relating to aircraft design features and airbase operations from an input source;

running a simulation of aircraft preparation operations including arming and fueling, followed by simulation of flying a mission, which includes calculation of battle damage, maintenance requirements, attrition of aircraft, and available aircraft;

providing output of the results for a number of runs; and repeating the step of running a simulation a given number of times.

2. A method of operation of a computer program model for analyzing the operations capabilities and support requirements of vehicle designs, comprising the steps:

reading data parameters relating to vehicle design features and base operations from an input source;

running a simulation of vehicle preparation operations including fueling, followed by simulation of performing a mission;

providing output of the results for a number of runs; and repeating the step of running a simulation a given number of times.

3. A method of operation of an airbase sortie generation analysis computer program model used in a computer system having a monitor with a screen and a keyboard connected thereto for interactive input by a user for analyzing the sortie (mission) generation capabilities and support requirements of aircraft designs, the operation of the airbase being analyzed by runs comprised of a number of days with a number of missions each day, wherein the method comprises the steps:

opening a print file to collect all non-graphics screen output and user inputs, means for reading input from the keyboard and to write or echo to the screen;

initializing a program execution counter (RUN) to zero;

providing input parameters for air base operation by reading interactive responses from the keyboard, and also by reading input files;

calculating and defining factors and initiating pointers relating to air base operation;

beginning execution of missions and outputting the results in a table and summary for each day, starting with a main loop to be executed for every mission, a mission number MI being initially set to one;

simulating various operations and generating output data relating thereto;

after the last mission of the day writing to the screen and to the output file the daily and cumulative data;

comparing the number of the day to the number of days for the run, to determine if this is the end of the run, and if not, returning to the beginning of the main loop to run the next mission;

effective after the output for the last day of the engagement giving the user the choice of a graphics option, and if the user does not want the graphics option at this time, giving the user the option of restarting the program for another run or stopping;

responsive to the user choosing the graphics option, plotting the results of this run and/or any previous runs as selected by the user, and then giving the user the option of restarting the program or stopping.

4. A method of operation of a computer program model used in a computer system having a monitor with a screen and a keyboard connected thereto for interactive input by a user for analyzing base operations and mission generation capabilities and support requirements of vehicle designs, the operation of the base being analyzed by runs comprised of a number of days with a number of missions each day, wherein the computer program model comprises:

opening a print file to collect all non-graphics screen output and user inputs, reading input from the keyboard and writing or echoing to the screen;

initializing a program execution counter (RUN) to zero;

providing input parameters for base operation by reading interactive responses from the keyboard, and also by reading input files;

calculating and defining factors and initiating pointers relating to base operation;

executing missions and outputting the results in a table and summary for each day, starting with a main loop to be executed for every mission, a mission number MI being initially set to one;

simulating various operations and generating output data relating thereto;

after the last mission of the day writing to the screen and to the output file the daily and cumulative data;

comparing the number of the day to the number of days for the run, to determine if this is the end of the run, and if not, returning to the beginning of the main loop to run the next mission;

after the output for the last day of the engagement, giving the user the choice of a graphics option, and if the user does not want the graphics option at this time, giving the user the option of restarting the program for another run or stopping;

responsive to the user choosing the graphics option, plotting the results of this run and/or any previous runs as selected by the user, and then giving the user the option of restarting the program or stopping.

5. An airbase sortie generation analysis computer program model for analyzing the sortie generation capabilities and support requirements of aircraft designs used in a computer system having a monitor with a screen and a keyboard connected thereto for interactive input by a user, comprising:

means for reading data parameters relating to aircraft design features and airbase operations from an input source;

means for running a simulation of aircraft preparation operations including arming and fueling, followed by simulation of flying a mission, which includes calculation of battle damage, maintenance requirements, attrition of aircraft, and available aircraft;

means providing output of the results for a number of runs; and means for repeating operation of the means for running a simulation a given number of times.

6. An airbase sortie generation analysis computer program model used in a computer system having a monitor with a screen and a keyboard connected thereto for interactive input by a user for analyzing the sortie (mission) generation capabilitie and support requirements of aircraft designs, the operation of the airbase being analyzed by runs comprised of a number of days with a number of missions each day, wherein the computer program model comprises:

means for opening a print file to collect all non-graphics screen output and user inputs, means for reading input from the keyboard and to write or echo to the screen;

means for initialization of a program execution counter (RUN) to zero;

means for providing for an air base attack option with a definition of when the base is under attack, with each of a given number of attack periods comprising a number of attack days (missions may be skipped on these days), means for providing values for a reduced maintenance factor array and a reduced rearm/refuel array for the attacks;

means for displaying a message on the screen and reading from the keyboard to determine if the run will be an air-base-attack case;

means responsive to selection of a non-air-base-attack case for setting all attack days to zero, and setting an attack counter (A) to a value one greater than said given number of attacks, and for setting reduced maintenance and rearm/refuel factors to one;

means responsive to selection of an air-base-attack case for interactively providing a name of an air-base-attack input file, which is a directory file which includes an air base open time and reduced payload capacity for each of the days of each attack period;

means for reading a runway open time from the identified air-base-attack input file, and reading a runway open time and reduced payload for missions completed during the attack days, means for initiating the attack counter (A) and taking the reduced maintenance and rearm/refuel factors from the arrays, means for reading a day and attack time when the main runway opens after each attack period;

means using the identified air-base-attack input file for providing base reopen times for each attack day, with any missions completed on these days having a given reduced payload capacity (a full payload capability being included among the main input parameters);

means operative for both an air-base-attack case and a non-air-base-attack case for incrementing the program execution counter;

means for interactively selecting one of three options for providing main input parameters, these options being (1) interactive input, (2) file input, and (3) modification of previous run; means responsive to selection any of these three options to enter values for variables as follows: number of aircraft in initial force, engagement length in days, mission flight time in minutes, aircraft critical mean time between failure (MTBF) in hours, fuel required (lbs. fuel/sortie), maintenance man-hour rate mmh/fh), maximum payload (no. of weapons); the input data being retained from the previous run for the third option; means for interactively providing the user a chance to change any of these parameters before beginning a run; and means for storing the run variables in print matrices;

means for interactively entering a file name containing daily combat attrition rates, with values which are percent attribution rates for each of the 30 days in the run, wherein these values, when multiplied by the number of aircraft flying a mission, provide the number of aircraft attrited during that mission;

means for initializing variables for cumulative attrition, daily attrition, missions skipped due to an attack and no print flags, day counter, daily sorties, cumulative sorties, fuel consumed and maintenance man-hours per flight-hour, current payload capacity, cumulative payload, daily payload, available aircraft, and ground attrition rates;

means for calculating a maintenance rate as the flight time divided by the mean time between failures in minutes;

means for initializing a maintenance and damage pointer, defining a normal day start time, starting a timer, and writing an output heading for the first day;

wherein the program then begins executing missions and outputting the results in a table and summary for each day of the engagement, starting with a main loop to be executed for every mission, a mission number MI being initially set to one;

means for checking the attack counter (A) to determine whether it is less than or equal to said given number of attack periods (this counter was either set to one plus said given number of attack periods non-attack cases, or initially set to one for attack cases), responsive to "yes" indicating that the base has been attacked to check whether the main runway is ready to reopen by a comparison of current time against a variable for time of day the main runway opens after each attack period, and is yes setting the payload to full capacity, increment the attack counter, and telling the user that the main runway is now open before executing the next mission;

means for setting a variable for the next engagement day; and for checking this variable to determine if it is one of the attack days, and if the base is under attack checking to see if a flag has been set indicating that missions have already been skipped, if missions have not been skipped, setting variables to reduce the payload capacity, calculating ground attrition and update the available aircraft, means for executing a mission skip routine and setting the mission skip flag (so same missions are not skipped again next time through the loop);

means for calculating ground time for rearming and refueling, and incrementing the time;

if it is not the end of day, means for proceeding to run a mission, which comprises calculating attrited aircraft and the number of sorties; incrementing daily sorties, payload, and attrition; calculating damaged aircraft, surviving aircraft, aircraft requiring maintenance, and mission capable of aircraft; also determining the time when damaged aircraft and aircraft requiring maintenance after the next mission will be available, reducing the number of available aircraft by the number of damaged aircraft and aircraft requiring maintenance; and also performing time calculations and updating;

means for testing the pool of aircraft in maintenance and damaged aircraft to determine which aircraft will be available for the next mission, the number of available aircraft being increased and a pointer being reset; there being a calculation of the number of aircraft returning from maintenance; and a calculation of the mission start time;

means operative responsive to an end-of-day indication for incrementing a day counter, resetting the mission skip flag, incrementing the time, testing the pool of available aircraft, and adding to the number of aircraft available;

means responsive to it being an attack day for incrementing an attack counter and setting attack variables;

means wherein all data generated by the most recent mission is written as output to the screen and to the output file;

means effective if it is not the end of day for incrementing the mission counter (MI) and beginning the main loop for the next mission;

means effective after the last mission of the day for writing to the screen and to the output file the daily and cumulative attrition; incrementing the cumulative sorties and payload; outputting the daily and cumulative sorties; outputting the daily and cumulative payload; saving the values for daily and cumulative sorties, daily and cumulative payload, daily and cumulative attrition, and available aircraft for the beginning of the next day; means for calculating and saving the daily and cumulative fuel consumption, and daily and cumulative maintenance man-hours; means for resetting the daily counters for attrition, sorties, payload, and ground attrition to zero;

wherein for each completed mission, the output includes the following:

(1) mission start time
(2) aircraft available to fly the mission
(3) aircraft attrited during the mission
(4) aircraft damaged during the mission
(5) total number and breakdown of aircraft entering maintenance cycles after the mission
(6) the number of aircraft returning from maintenance during this mission that will be available for the next mission
(7) the number of aircraft that flew this mission and require no maintenance before flying again;

means for comparing the number of the day to the number of days for the run, to determine if this is the end of the run, and if not, returning to the beginning of the main loop to run the next mission;

means effective after the output for the last day of the engagement for giving the user the choice of a graphics option, and if the user does not want the graphics option at this time, giving the user the option of restarting the program for another run or stopping;

means responsive to the user choosing the graphics option for plotting the results of this run and/or any previous runs as selected by the user, and then giving the user the option of restarting the program or stopping.

7. An airbase sortie generation analysis computer program model used in a computer system having a monitor with a screen and a keyboard connected thereto for interactive input by a user for analyzing the sortie (mission) generation capabilities and support requirements of aircraft designs, the operation of the airbase being analyzed by runs comprised of a number of days with a number of missions each day, wherein the computer program model comprises:

means for opening a print file to collect all non-graphics screen output and user inputs, means for reading input from the keyboard and to write or echo to the screen;

means for initialization of a program execution counter (RUN) to zero;

means for providing input parameters for air base operation by reading interactive responses from the keyboard, and also by reading input files;

means for calculating and defining factors and initiating pointers relating to air base operation;

wherein the program then begins executing missions and outputting the results in a table and summary for each day, starting with a main loop to be executed for every mission, a mission number MI being initially set to one;

means for simulating various operations and generating output data relating thereto;

means effective after the last mission of the day for writing to the screen and to the output file the daily and cumulative data;

means for comparing the number of the day to the number of days for the run, to determine if this is the end of the run, and if not, returning to the beginning of the main loop to run the next mission;

means effective after the output for the last day of the engagement for giving the user the choice of a graphics option, and if the user does not want the graphics option at this time, giving the user the option of restarting the program for another run or stopping;

means responsive to the user choosing the graphics option for plotting the results of this run and/or any previous runs as selected by the user, and then giving the user the option of restarting the program or stopping.

8. A computer program model used in a computer system having a monitor with a screen and a keyboard connected thereto for interactive input by a user for analyzing base operations and mission generation capabilities and support requirements of vehicle designs, the operation of the base being analyzed by runs comprised of a number of days with a number of missions each day, wherein the computer program model comprises:

means for opening a print file to collect all non-graphics screen output and user inputs, means for reading input from the keyboard and to write or echo to the screen;

means for initialization of a program execution counter (RUN) to zero;

means for providing input parameters for base operation by reading interactive responses from the keyboard, and also by reading input files;

means for calculating and defining factors and initiating pointers relating to base operation;

wherein the program then begins executing missions and outputting the results in a table and summary for each day, starting with a main loop to be executed for every mission, a mission number MI being initially set to one;

means for simulating various operations and generating output data relating thereto;

means effective after the last mission of the day for writing to the screen and to the output file the daily and cumulative data;

means for comparing the number of the day to the number of days for the run, to determine if this is the end of the run, and if not, returning to the beginning of the main loop to run the next mission;

means effective after the output for the last day of the engagement for giving the user the choice of a graphics option, and if the user does not want the graphics option at this time, giving the user the option of restarting the program for another run or stopping;

means responsive to the user choosing the graphics option for plotting the results of this run and/or any previous runs as selected by the user, and then giving the user the option of restarting the program or stopping.

* * * * *

UNITED STATES PATENT AND TRADEMARK OFFICE
CERTIFICATE OF CORRECTION

PATENT NO. : 4,926,362
DATED : May 15, 1990
INVENTOR(S) : Richard A. Carns et al It is certified that error appears in the above-identified patent and that said Letters Patent is hereby corrected as shown below:

Col 1, line 32, "stimulate" should be ---simulate---.

Col 1, line 60, "meanns" should be ---means---.

Col 3, line 36, "stimulates" should be ---simulates---.

Col 4, line 3, "stimulates" should be ---simulates---.

Col 6, line 10, before "another" ---If--- should be inserted.

Col 6, line 11, after "block" ---46--- should be inserted.

inserted.

Col 8, line 6, the "1" should be deleted.

Col 8, line 37, "O" should be ---$\underline{O}$---.

Col 48, claim 6, line 5, "capabilitie" should be --capabilities--.

Signed and Sealed this

Tenth Day of November, 1992

*Attest:*

DOUGLAS B. COMER

*Attesting Officer*  *Acting Commissioner of Patents and Trademarks*